United States Patent
Shah et al.

(10) Patent No.: US 11,835,927 B2
(45) Date of Patent: *Dec. 5, 2023

(54) REDUCING SUBSTRATE SURFACE SCRATCHING USING MACHINE LEARNING

(71) Applicant: APPLIED MATERIALS, INC., Santa Clara, CA (US)

(72) Inventors: Kartik B Shah, Saratoga, CA (US); Satish Radhakrishnan, San Jose, CA (US); Karthik Ramanathan, Bangalore (IN); Karthikeyan Balaraman, Bangalore (IN); Adolph Miller Allen, Oakland, CA (US); Xinyuan Chong, Milpitas, CA (US); Mitrabhanu Sahu, San Jose, CA (US); Wenjing Xu, San Jose, CA (US); Michael Sterling Jackson, Sunnyvale, CA (US); Weize Hu, Sunnyvale, CA (US); Feng Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/068,469

(22) Filed: Dec. 19, 2022

(65) Prior Publication Data

US 2023/0121513 A1 Apr. 20, 2023

Related U.S. Application Data

(63) Continuation of application No. 17/360,652, filed on Jun. 28, 2021, now Pat. No. 11,586,160.

(51) Int. Cl.
G05B 13/02 (2006.01)
G05B 13/04 (2006.01)

(52) U.S. Cl.
CPC ....... *G05B 13/0265* (2013.01); *G05B 13/048* (2013.01)

(58) Field of Classification Search
CPC ............... G01K 7/182; H01J 2237/334; H01J 37/32724; H01L 21/67063; H01L 21/67213; H05B 1/0233
See application file for complete search history.

(56) References Cited

U.S. PATENT DOCUMENTS

| | | | |
|---|---|---|---|
| 10,096,509 B2 * | 10/2018 | Wang | H01L 21/68757 |
| 2003/0040188 A1 * | 2/2003 | Hsu | H01L 21/3212 |
| | | | 257/E21.175 |

(Continued)

FOREIGN PATENT DOCUMENTS

| | | |
|---|---|---|
| WO | 2018052698 A1 | 3/2018 |
| WO | 2021030833 A1 | 2/2021 |

OTHER PUBLICATIONS

PCT International Search Report and Written Opinion for International Application No. PCT/US2022/034792 dated Oct. 13, 2022, 10 pages.

*Primary Examiner* — John Kwon
(74) *Attorney, Agent, or Firm* — Lowenstein Sandler LLP

(57) ABSTRACT

Process recipe data associated a process to be performed for a substrate at a process chamber is provided as input to a trained machine learning model. A set of process recipe settings for the process that minimizes scratching on one or more surfaces of the substrate is determined based on one or more outputs of the machine learning model. The process is performed for the substrate at the process chamber in accordance with the determined set of process recipe settings.

20 Claims, 8 Drawing Sheets

(56) References Cited

U.S. PATENT DOCUMENTS

| | | |
|---|---|---|
| 2007/0040265 A1 | 2/2007 | Umotoy et al. |
| 2008/0041716 A1* | 2/2008 | Alpay .................. G03F 1/26 |
| | | 204/192.2 |
| 2011/0315080 A1* | 12/2011 | Choi ................ H01L 21/68742 |
| | | 118/500 |
| 2016/0265111 A1* | 9/2016 | Horiike .................. B32B 27/36 |
| 2017/0193360 A1 | 7/2017 | Gao et al. |
| 2019/0235391 A1 | 8/2019 | Bijnen et al. |
| 2019/0362221 A1 | 11/2019 | Ando et al. |
| 2020/0279066 A1 | 9/2020 | Banna et al. |
| 2020/0368815 A1 | 11/2020 | Baker et al. |
| 2021/0162560 A1* | 6/2021 | Ahn ..................... B24B 37/24 |
| 2021/0270673 A1 | 9/2021 | Thompson |
| 2021/0304032 A1 | 9/2021 | Wakita et al. |
| 2022/0011728 A1 | 1/2022 | Zhang et al. |
| 2022/0082949 A1 | 3/2022 | Hubaux et al. |
| 2022/0171373 A1 | 6/2022 | Chau et al. |
| 2022/0413452 A1* | 12/2022 | Shah ................ H01L 21/68742 |

* cited by examiner

REDUCING SUBSTRATE SURFACE SCRATCHING USING MACHINE LEARNING

RELATED APPLICATION

This application is a continuation application of and claims priority to, U.S. patent application Ser. No. 17/360,652, filed Jun. 28, 2021, which is hereby incorporated by reference herein in its entirety for all purposes.

TECHNICAL FIELD

Embodiments of the present disclosure relate, in general, to manufacturing systems and more particularly to reducing substrate surface scratching using machine learning.

BACKGROUND

A substrate temperature control process, such as a substrate heating process or a substrate cooling process, can be performed for a substrate at a process chamber of a manufacturing system (e.g., prior to or following a substrate etch process, a substrate deposition process, etc.). During the substrate temperature control process, the substrate can be secured to a substrate support assembly while one or more temperature control elements of the process chamber (e.g., heaters embedded within the substrate support assembly, etc.) are activated to control the temperature of the substrate to a target temperature, in accordance with a substrate temperature control process recipe. As the temperature of the substrate increases or decreases at the substrate support assembly, one or more surfaces of the substrate can become in direct contact with components of the process chamber (e.g., a workpiece surface of the substrate support assembly) and scratches can form on the one or more surfaces.

The scratches formed on the one or more surfaces of the substrate can significantly damage the substrate and in some instances make the substrate unusable. Particles can be generated from the one or more scratches formed on the substrate and can be distributed throughout the process chamber. These generated particles can further damage the substrate and/or components of the process chamber, as well as other substrates that are processed at the process chamber. However, it can be difficult for an operator of the manufacturing system to identify settings for the substrate temperature control process recipe that minimize the number of particles as well as the number, length, and/or depth of the scratches on the one or more surfaces of the substrate.

SUMMARY

Some of the embodiments described cover a method training a machine learning model to predict process recipe settings for a substrate temperature control process to be performed for a current substrate at a manufacturing system. The method includes generating first training data for the machine learning model. The first training data includes historical data associated with one or more prior process recipe settings for a prior substrate temperature control process performed for a prior substrate at a prior process chamber. The method further includes generating second training data for the machine learning model. The second training data is associated with a historical scratch profile of one or more surfaces of the prior substrate after performance of the prior substrate temperature control process according to the one or more prior process recipe settings. The method further includes providing the first training data and the second training data to train the machine learning model to predict, for the substrate temperature control process to be performed for the current substrate, which process recipe settings correspond to a target scratch profile for one or more surfaces of the current substrate.

In some embodiments, a system including a memory and a processing device coupled to the memory is provided. The processing device is to perform operations including providing, as input to a trained machine learning model, data associated with a process recipe for a substrate temperature control process to be performed for a substrate at a process chamber. The operations further include obtaining one or more outputs of the machine learning model. The operations further include determining, from the one or more outputs, temperature control process data identifying one or more sets of process recipe settings and, for each set of process recipe settings, an indication of a level of confidence that a respective set of process recipe settings corresponds to a target scratch profile for one or more surfaces of the substrate. The operations further include, responsive to identifying the respective set of process recipe settings with a level of confidence that satisfies a level of confidence criterion, performing the substrate temperature control process for the substrate at the process chamber in accordance with the respective process recipe settings.

In some embodiments, a non-transitory computer readable storage medium includes instructions that, when executed by a processing device, cause the processing device to perform operations including generating first training data for the machine learning model. The first training data includes historical data associated with one or more prior process recipe settings for a prior substrate temperature control process performed for a prior substrate at a prior process chamber. The operations further include generating second training data for the machine learning model. The second training data is associated with a historical scratch profile of one or more surfaces of the prior substrate after performance of the prior substrate temperature control process according to the one or more prior process recipe settings. The operations further include providing the first training data and the second training data to train the machine learning model to predict, for the substrate temperature control process to be performed for the current substrate, which process recipe settings correspond to a target scratch profile for one or more surfaces of the current substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
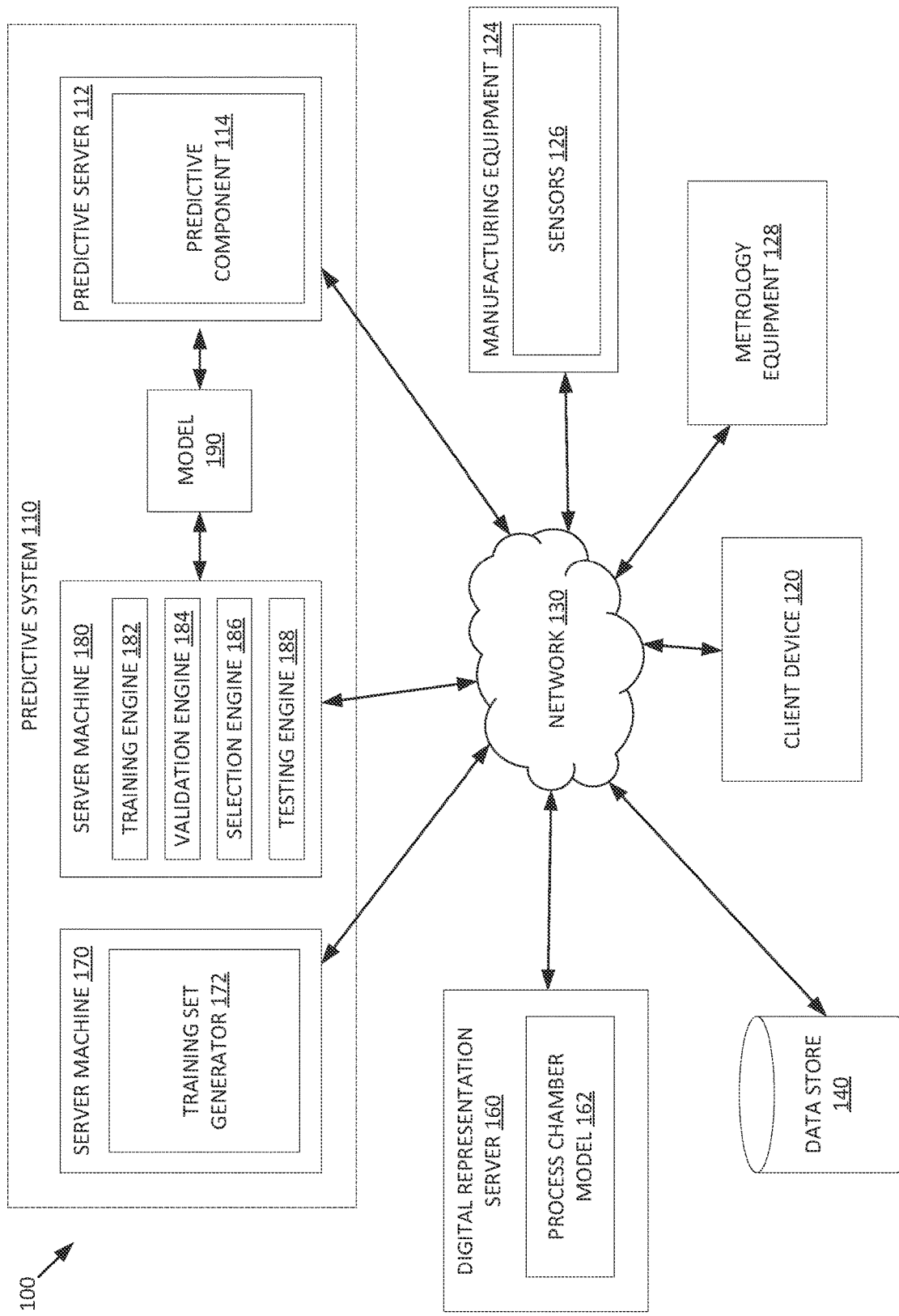
FIG. 1 depicts an illustrative computer system architecture, according to aspects of the present disclosure.

Implementations described herein provide systems and methods for reducing substrate surface scratching using machine learning. A substrate temperature control process can be performed for a substrate (e.g., prior to and/or following a substrate etch process, a substrate deposition process, etc.) at a process chamber. For example, a substrate heating process can be performed to heat a substrate to a target temperature before an etch process and/or a deposition process is initiated at the process chamber. In another example, a substrate cooling process can be performed to cool a substrate to a target temperature before the substrate is removed from the process chamber after a substrate etch process or a substrate deposition process.

During the substrate temperature control process, the substrate can be secured to a substrate support assembly of the process chamber. In some embodiments, the substrate support assembly can be or include an electrostatic chuck including one or more chucking electrodes that, when activated, generate an electrostatic force that secures the substrate to the substrate support assembly. In other or similar embodiments, the substrate support assembly can be or include a vacuum chuck that includes one or more channels coupled to a vacuum pump. When the vacuum pump is activated, a vacuum pressure is created in the one or more channels and at a gap between a bottom surface of the substrate and a workpiece surface of the substrate support assembly. The vacuum pressure at the gap between the substrate and the substrate support assembly secures the substrate to the substrate support assembly. In other or similar embodiments, the substrate support assembly can include one or more pins that are configured to engage to corresponding receptacles for the substrate.

In some embodiments, the substrate support assembly can include one or more temperature control elements that are configured to control the temperature of the substrate secured to the substrate support assembly. For example, an electrostatic chuck or a vacuum chuck can include one or more heating elements that, when activated, are configured to heat the substrate to a target temperature. In another example, an electrostatic chuck or a vacuum chuck can include one or more cooling components (e.g., one or more cooling channels, a cooling plate, etc.) that is configured to cool the substrate to a target temperature. In other or similar embodiments, one or more components of the process chamber can facilitate heating and/or cooling of the substrate secured to the substrate support assembly. For example, the process chamber can flow a temperature controlled gas into a gap between the substrate and the substrate support assembly to heat or cool the substrate to a target temperature.

During a substrate temperature control process, scratches can form on one or more surfaces of the substrate. The number, depth, and/or length of scratches formed on a surface of the substrate (referred to herein as a scratch profile) can depend on one or more conditions within the process chamber. For example, a pressure of the environment of the process chamber at the gap between the substrate and the substrate support assembly can be different from a pressure of the environment of the process chamber at other portions of the process chamber (referred to as a pressure differential). If the pressure of the environment above the substrate (e.g., between the substrate and a lid and/or showerhead of the process chamber) is larger than the pressure of the environment below the substrate (i.e., between the substrate and the substrate support assembly), the environment of the surface above the substrate can force the substrate to directly interface with the workpiece surface of the substrate support assembly. This phenomenon is referred to herein as downforce. The amount of downforce applied to a substrate can impact a number of scratches and/or the depth of the scratches formed on a bottom surface of the substrate (i.e., the surface that interfaces with the workpiece surface of the substrate support assembly). For example, a large number of deep scratches can form on a bottom surface of a substrate that is subject to a large amount of downforce during the substrate temperature control process, while a smaller number shallow scratches can form on the bottom surface of a substrate that is subject to a lesser amount of downforce.

In some embodiments, the scratch profile for one or more surfaces of the substrate can also depend on a temperature of the substrate, the substrate support assembly, and/or the environment of the process chamber before, during, or after the substrate temperature control process. For example, if temperature control elements at the process chamber rapidly increase or decrease the temperature of the substrate, a material of the substrate (e.g., silicon) can rapidly expand or contract. The rapid expansion or contraction of the material of the substrate can cause the number of scratches and/or the length of scratches formed on the bottom surface of the substrate to increase when the substrate is removed (e.g., dechucked) from the substrate support assembly.

Substrate particles can be generated within the process chamber from the scratches formed on the one or more surfaces of the substrate. The number and/or size of substrate particles that are generated depend on the scratch profile for the substrate during or after the completion of the substrate temperature control process. In some instances, the substrate particles generated from the bottom surface of the substrate can be distributed throughout the environment of the process chamber and land on the top surface of the substrate. In some instances, the scratch profile at the top and/or bottom surfaces of the substrate can include a significant number of long and deep scratches, which can render the substrate unusable for any subsequent substrate processes. As a result, a significant number of substrates can be discarded, reducing the overall throughput and overall efficiency of the manufacturing system. In other instances, the substrate particles can be distributed to other components of the process chamber and can damage the other components. As a result, a process chamber can be unavailable for processing substrates as the damaged components are maintenance and or replaced, further reducing the overall throughput and overall efficiency of the manufacturing system. In addition, if scratches are formed at one or more substrates processed at a process chamber, a significant number of particles can be generated and remain at the process chamber between substrate processes. The process chamber can be unavailable for processing substrates as the process chamber is cleaned to remove the particles, even further reducing the overall throughput and efficiency of the manufacturing system.

Aspects of the present disclosure address the above noted and other deficiencies by providing systems and methods for reducing substrate surfaces scratching using machine learning. A processing device for a manufacturing system can provide, as input to a trained machine learning model, data associated with a process recipe for a substrate temperature control process to be performed for a substrate at a process chamber. In some embodiments, the processing device can receive the data from a client device for the manufacturing system. A user (e.g., an operator, an engineer, etc.) can provide the data associated with the process recipe via a graphical user interface (GUI) of the client device and the client device can transmit the received data to the processing device for the manufacturing system.

The machine learning model can be trained to predict one or more process recipe settings for a substrate temperature control process to be performed for a substrate that correspond to a target scratch profile for one or more surfaces of the substrate. In some embodiments, the target scratch profile for the one or more surfaces can correspond to a minimal number of surface scratches on the one or more surfaces of the substrate after completion of the substrate temperature process, a minimal depth of the surfaces scratches, or a minimal length of the surface scratches. For example, the target scratch profile can correspond to the smallest number of scratches (e.g., zero scratches or approximately zero scratches), the shallowest depth of the scratches, and/or the shortest length of the scratches that is possible at a process chamber. In other or similar embodiments, the target scratch profile can correspond to a number of scratches, a depth of scratches, and/or a length of scratches that satisfies one or more scratching criteria associated with the process chamber and/or the manufacturing system. For example, the target scratch profile can correspond to a number of scratches that falls below a threshold number of scratches, a depth of the scratches that falls below a threshold depth of the scratches, and/or a length of the scratches that falls below a threshold length of the scratches.

The machine learning model can be trained using at least first and second training data. The first training data can be generated for the machine learning model that includes historical data associated with one or more prior process recipe settings for a prior substrate temperature control process at a prior process chamber. In some embodiments, the prior substrate temperature control process can be a physical temperature control process performed at a physical process chamber. In other or similar embodiments, the prior substrate temperature control process can be a simulated substrate temperature control process performed at a digital replica of a process chamber. The second training data can be generated that is associated with a historical scratch profile (e.g., a number or intensity of scratches, a length of the scratches, and/or a depth of the scratches) of one or more surfaces of the prior substrate after performance of the prior substrate temperature control process according to the one or more prior process recipe settings.

In response to providing the data associated with the process recipe as input to the trained machine learning model, the processing device can obtain one or more an outputs of the trained machine learning model. The one or more outputs can include temperature control process data that identifies one or more sets of process recipe settings and for each set of process recipe settings, an indication of a level of confidence that a respective set of process recipe settings corresponds to the target scratch profile for one or more surfaces of the surface. In some embodiments, each set of process recipe settings can include a positional setting for a position of the substrate within the process chamber (e.g., relative to the substrate support assembly and/or a lid or showerhead of the process chamber), a temperature setting for one or more components of the process chamber (e.g., a heating element, a cooling channel, etc.), a gas flow setting associated with a gas flowed into the process chamber during the substrate temperature control process, and/or a time period setting associated with a length of a time period of the performance of the substrate temperature control process. The processing device can identify a respective set of substrate process settings that satisfies a level of confidence criterion (e.g., exceeds a level of confidence threshold) and can perform the substrate temperature control process according to the respective set of substrate process settings.

Aspects of the present disclosure address deficiencies of the conventional technology by providing systems and methods for providing one or more process recipe settings for a substrate temperature control process that are to reduce scratches on one or more surfaces of a substrate. Using data associated with prior substrate temperature control processes (e.g., physical processes or simulated processes), the machine learning model can be trained to predict one or more process recipe settings that correspond to a target scratch profile for a substrate, which are applied for a substrate temperature process performed for a current substrate by a processing device for the manufacturing system. By using a machine learning model to predict the process recipe settings that correspond to the target scratch profile, a user (e.g., an operator, an engineer) can more easily identify process recipe settings that can minimize scratches on the surface of the substrate. In addition, to minimize scratches on the surface of the substrate, the identified process recipe settings can also satisfy constraints (e.g., achieving a target substrate temperature, a minimal process length, etc.).

By applying the settings for the substrate temperature process that are obtained from the output of the trained machine learning model, a number, an intensity, length, and/or depth of scratches on one or more surfaces of a substrate can be significantly reduced, which reduces a number of particles generated during a respective substrate temperature control process. Accordingly, a fewer number of substrates and/or components of a process chamber are damaged from substrate particles generated from substrate surfaces scratches, which improves an overall throughput and efficiency of a manufacturing system. In addition, as a fewer number of particles are generated at a process chamber, a fewer number of cleaning processes are performed for the process chamber to remove substrate particles, which also improves the overall throughput and efficiency of the manufacturing system.

FIG. 1 depicts an illustrative computer system architecture 100, according to aspects of the present disclosure. Computer system architecture 100 can include a client device 120, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. In some embodiments, computer system architecture 100 can be included as part of a manufacturing system for processing substrates. In such embodiments, computer system architecture 100 can include manufacturing equipment 124, metrology equipment 128 and/or testing equipment (not shown).

Manufacturing equipment 124 can produce products, such as electronic devices, following a recipe or performing runs over a period of time. Manufacturing equipment 124 can include a process chamber, such as process chamber 200 described with respect to FIG. 2. Manufacturing equipment 124 can perform a process for a substrate (e.g., a wafer, etc.) at the process chamber. Examples of substrate processes include a deposition process to deposit a film on a surface of the substrate, an etch process to form a pattern on the surface of the substrate, a substrate heating process to heat a substrate to a target temperature prior to a deposition process or an etch process, a substrate cooling process to cool a substrate to a target temperature following a deposition process and/or an etch process, etc. Manufacturing equipment 124 can perform each process according to a process recipe. A process recipe defines a particular set of operations to be performed for the substrate during the process and can include one or more settings associated with each operation. For example, a substrate heating process can include a positional setting for the substrate disposed within the process chamber, a temperature setting for the process chamber, a pressure setting for the process chamber, a pressure setting for the process chamber, one or more gas settings associated for the process chamber (e.g., a type of the gas flowed into the process chamber, etc.

In some embodiments, manufacturing equipment 124 can include one or more sensors 126 configured to generate process sensor data for an environment within or outside of a process chamber and/or a substrate disposed within the process chamber. Sensor data can include a value of one or more of temperatures (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate processed at manufacturing equipment 124.

Metrology equipment 128 can provide metrology data associated with substrates (e.g., wafers, etc.) processed by manufacturing equipment 124. In some embodiments, metrology data can include data generated for a film on a surface of a substrate before, during, or after a deposition and/or an etch process is performed for that substrate. For example, metrology data can include a value of film property data (e.g., wafer spatial film properties), dimensions (e.g., thickness, height, etc.), dielectric constant, dopant concentration, density, defects, etc. generated for a substrate after completion of a substrate process. In some embodiments, the metrology data can further include data associated with a portion of a substrate that is not subject to a deposition and/or an etch process. For example, a film can be deposited on a top surface of a substrate prior to an etch process that is to etch away a portion of the film and create a target substrate surface pattern. A substrate heating process can be initiated for the substrate to heat the substrate to a target temperature prior to initiate of the etch process. During the substrate heating process, one or more scratches can be made at a bottom surface of the substrate (e.g., caused by a frictional force between the bottom surface of the substrate an interfacing surface of a substrate support assembly of the process chamber). Metrology equipment 128 can generate metrology data corresponding to a number of scratches at the bottom surface of the substrate, a length of each scratch at the bottom surface of the substrate, a depth of each scratch at the bottom surface of the substrate, etc.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, computer system architecture 100 can receive data associated with a process recipe for a process to be performed for a substrate at manufacturing equipment 124 from client device 120. For example, client device 120 can display a graphical user interface (GUI), where the GUI enables a user (e.g., an engineer, an operator, a developer, etc.) to provide, as input, data associated with one or more process recipe settings for a substrate heating process and/or a substrate cooling process to be performed for a substrate at a process chamber of manufacturing equipment 124. In some embodiments, the GUI of client device 120 can provide an indication of one or more modifications that can be made to the one or more provided process recipe settings to minimize at least one of a number of scratches on a surface of the substrate, a depth of the scratches, or a length of the scratches, in accordance with embodiments provided herein.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). In some embodiments, data store 140 can store sensor data, metrology data, predictive data, and/or contextual data. Sensor data can include historical sensor data (e.g., sensor data generated by sensors 126 for a previous substrate processed at manufacturing equipment 124) and/or current sensor data (e.g., sensor data generated by sensors 126 for a current substrate being processed at manufacturing equipment 124). In some embodiments, current sensor data can be data for which predictive data is generated. Sensor data can include but is not limited to, data indicating a temperature of one or more components of manufacturing equipment 124 (e.g., a temperature of a lid and/or a window of a process chamber, a temperature of a heating element embedded within a substrate support assembly of the process chamber, etc.), data indicating a temperature of a substrate during a substrate process, data indicating a pressure at one or more portions of an environment within manufacturing equipment 124 (e.g., a pressure of the environment between a lid and/or window of a process chamber and a surface of a substrate, a pressure of the environment between a surface of a substrate and a surface of a substrate support assembly, etc.), data indicating a concentration or flow rate of one or more gases flowed into manufacturing equipment 124 before, during and/or after a substrate process, and so forth. Data store can store metrology data, in some embodiments. Metrology data can include historical metrology data (e.g., metrology data generated by metrology equipment 128 for a previous substrate processed at manufacturing equipment 124).

Contextual data refers to data associated with a substrate and/or a substrate process performed at manufacturing equipment 124. In some embodiments, contextual data can include data associated with the substrate (e.g., such as an identifier for a substrate, a type of the substrate, etc.). Contextual data can additionally or alternatively include data associated with one or more components of manufacturing equipment 124 used to process the substrate. For example, contextual data can include an identifier for the one or more components of manufacturing equipment 124, one or more physical properties associated with the one or more components (e.g. an emissivity of the one or more components, a molecular weight of the one or more components, etc.), an identifier associated with an operator of manufacturing equipment 124, a type of the process performed at manufacturing equipment 124, etc.

In additional or alternative embodiments, contextual data can include data associated with a process recipe performed for the substrate at manufacturing equipment 124. For example, contextual data can include an identifier of a name for the process recipe, an operation number for an operation of the process recipe, or settings for one or more operations of the process recipe (referred to herein as a process recipe setting). A process recipe setting can include a positional setting for the substrate or one or more components of manufacturing equipment 124, such as a setting for a position of a substrate disposed within a process chamber relative to a lid and/or a window of the process chamber, a position of the substrate relative to a substrate support assembly of the process chamber, a position of the substrate support assembly relative to the lid and/or the window of the process chamber, a velocity of a movement of the substrate support assembly (with or without a substrate) toward or away from the lid and/or the window of the process chamber, a velocity of a movement of the substrate toward or away from a surface of the substrate support assembly, etc. A process recipe setting can also include a temperature and/or pressure setting for one or more components of manufacturing equipment 124 and/or the substrate disposed within manufacturing equipment 124. A process recipe setting can also include a gas flow setting for the substrate process, including a setting indicating a target composition and/or concentration of a gas flowed into a process chamber of manufacturing equipment 124, a flow rate of the gas flowed into the process chamber, a temperature of the gas flowed into the process chamber, etc.

Contextual data can include historical contextual data (e.g., contextual data for a prior substrate process performed for a prior substrate at manufacturing equipment 124) and/or current contextual data (e.g., contextual data for a substrate process currently performed or to be performed for a current substrate at manufacturing equipment 124). Current contextual data can be data for which predictive data is generated, in accordance with embodiments described herein. Historical contextual data and/or current contextual data can be provided to system 100 via a GUI of client device 120, in accordance with previously described embodiments.

In some embodiments, data store 140 can be configured to store data that is not accessible to a user of the manufacturing system. For example, testing data, contextual data, etc. for a substrate support assembly is not accessible to a user (e.g., an operator) of the manufacturing system and/or testing system. In some embodiments, all data stored at data store 140 can be inaccessible by the user of the system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, predictive system 110 can include a server machine 170 and/or a server machine 180. Server machine 170 includes a training set generator 172 that is capable of generating training data sets (e.g., a set of data inputs and a set of target outputs) to train, validate, and/or test a machine learning model 190. For example, training set generator 172 can generate training sets to train, validate, and/or test machine learning model 190 to predict process recipe settings for a substrate temperature control process (e.g., a substrate heating process, a substrate cooling process, etc.) to be performed for a substrate at manufacturing equipment 124, in accordance with embodiments provided herein.

In some embodiments, training set generator 172 can generate training sets for machine learning model 190 based on historical sensor, metrology, and/or contextual data associated with one or more prior substrate processes performed at manufacturing equipment 124. In additional or alternative embodiments, training set generator 172 can generate training sets for machine learning model 190 based on predictive or simulated sensor, metrology, and/or contextual data generated by a digital replica model (e.g., digital twin) of manufacturing equipment 124. A digital replica model (also referred to as a digital replica herein) can be an algorithmic model that simulates manufacturing equipment 124, in some embodiments.

In some embodiments, digital representation server 160 can be a digital replica of manufacturing equipment 124. Digital representation server 160 can use supervised machine learning, semi-supervised learning, unsupervised machine learning, or any combination thereof to generate a virtual representation of the physical elements and/or the dynamics of how manufacturing equipment 124 operations. Digital representation server 160 can be updated via reinforcement learning using periodic updates from sensors 126 and/or data associated with generating and maintaining the digital replica data of manufacturing equipment 124, such as sensor data, performance data (e.g., data associated with an efficiency, latency, throughput, etc. of one or more components of manufacturing equipment 124), library data, etc. In some embodiments, digital representation server 160 can include a processing chamber model 162 that is associated with the physical elements and dynamics of a process chamber of manufacturing equipment 124.

Digital representation server 160 can generate simulation data that is used to determine how manufacturing equipment 124 would perform based on current or simulated parameters. The simulation data can be stored at data store 140, in some embodiments. In some embodiments, the simulation data can include one or more process recipe settings associated with a substrate process (e.g., a substrate temperature control process) for a substrate at a process chamber. The simulation data can also include predicted property data and/or predicted metrology data (e.g., virtual metrology data) of the digital replica of manufacturing equipment 124 (e.g., of products to be produced or that have been produced using current sensor data at data store 140). The simulation data can also include an indication of abnormalities (e.g., abnormal products, abnormal components, abnormal manufacturing equipment 124, abnormal energy usage, etc. and one or more causes of the abnormalities. For example, the simulation data can include an indication of a number of scratches on one or more surfaces of a substrate after performance of a substrate process, a depth of the scratches, and/or a length of the scratches, as well as the one or more causes of the scratches. The simulation data can further include an indication of an end of life of a component of manufacturing equipment 124. The simulation data can be all encompassing, covering every mechanical and/or electrical aspect of manufacturing equipment 124.

As described above, training set generator 172 can generate training data for model 190 based on predictive or simulated data obtained from digital representation server 160. For example, training set generator 172 can generate one or more sets of process recipe settings and provide the sets of process recipe settings to digital representation server 160 to simulate a substrate process (e.g., a substrate temperature control process) at a process chamber of manufacturing equipment 124 using process chamber model 162. Process chamber model 162 can provide, as output, data corresponding to a simulated number of scratches on one or more surfaces of a substrate after performance of the simulated substrate process according to the one or more sets of process recipe settings, a simulated depth of the scratches, and/or a simulated length of the scratches. In some embodiments, the data output by process chamber model 162 can include a pressure differential between a first space of the process chamber environment and a second space of the process chamber environment. The first space of the process chamber environment can include a space between a top surface of the substrate and a ceiling (e.g., a lid, a window, etc.) of the process chamber. The second space of the process chamber environment can include a space between a bottom surface of the substrate and a top surface of a substrate support assembly that supports the substrate during the simulated substrate process. In additional or alternative embodiments, the data output by process chamber model 162 can include data associated with a rate of change of a temperature of the substrate between an initial period of the substrate process and a final period of the substrate process (referred to as a ramping rate). In some embodiments, the training set generator 172 can partition the training data (e.g., data for a physical process and/or simulated data) into a training set, a validating set, and a testing set. In some embodiments, the predictive system 110 generates multiple sets of training data. Some operations of training set generator 172 are described in detail below with respect to FIG. 2.

Server machine 180 can include a training engine 182, a validation engine 184, a selection engine 186, and/or a testing engine 188. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can use one or more of support vector machine (SVM), Radial Basis Function (RBF), clustering, supervised machine learning, semi-supervised machine learning, unsupervised machine learning, k-nearest neighbor algorithm (k-NN), linear regression, random forest, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 186 can be capable of selecting a trained machine learning model 190 that has an accuracy that meets a threshold accuracy. In some embodiments, the selection engine 186 can be capable of selecting the trained machine learning model 190 that has the highest accuracy of the trained machine learning models 190.

The testing engine 188 can be capable of testing a trained machine learning model 190 using a corresponding set of features of a testing set from data set generator 172. For example, a first trained machine learning model 190 that was trained using a first set of features of the training set can be tested using the first set of features of the testing set. The testing engine 186 can determine a trained machine learning model 190 that has the highest accuracy of all of the trained machine learning models based on the testing sets.

Predictive server 112 includes a predictive component 114 that is capable of providing one or more process recipe settings that correspond to a target scratch profile for a current substrate to be processed at manufacturing equipment 124. As described above, a target scratch profile can correspond to a minimal number of surface scratches on one or more surfaces of the substrate (e.g., zero scratches or approximately zero scratches) after completion of the substrate temperature process, a minimal depth of the surface scratches, and/or a minimal length of the surfaces scratches, in some embodiments. In other or similar embodiments, the target scratch profile can correspond to a number of scratches, a depth of scratches, and/or a length of scratches that satisfies one or more scratching criteria associated with the process chamber and/or the manufacturing system. For example, the target scratch profile can correspond to a number of scratches that falls below a threshold number of scratches, a depth of the scratches that falls below a threshold depth of the scratches, and/or a length of the scratches that falls below a threshold length of the scratches.

As described in detail below with respect to FIG. 6, in some embodiments, predictive component 114 is capable of providing data associated with a process recipe for a substrate process (e.g., a substrate temperature control process) to be performed for a substrate as an input to model 190 and obtain one or more outputs of model 190. In some embodiments, the data associated with the process recipe can include an indication of one or more operations to be performed for the process recipe and a target temperature for the substrate at a final period of the substrate process. The process recipe data can include, in some embodiments, one or more target substrate process settings to be applied during the substrate process. Predictive server 112 can identify one or more process recipe settings that correspond to the one or more operations and/or the target temperature for the substrate based on the one or more outputs of model 190. In response to determining that the one or more process recipe settings satisfies a level of confidence criterion, predictive server 112 can cause the substrate process to be performed for the substrate at the process chamber in accordance with the one or more process recipe settings.

In some embodiments, predictive server 112 can transmit an indication of the one or more process recipe settings to client device 120 as a suggested modification to the one or more target substrate process recipe settings. Client device 120 can display the suggest modifications to the target substrate process recipe settings via a GUI of client device 120. A user (e.g., an operator, an engineer, a developer, etc.) of system 100 can interact with one or more elements of the GUI of client device 120 to cause the substrate process to be initiated or not to be initiated for the substrate in accordance with the one or more process recipe settings obtained from an output of model 190.

The client device 120, manufacturing equipment 124, data store 140, digital representation server 160, predictive server 112, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, data store 140, digital representation server 160, predictive server 112, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of digital representation server 160, server machines 170 and 180, as well as predictive server 112, can be provided by a fewer number of machines. For example, in some embodiments, digital representation server 160, server machine 170 and/or server machine 180 can be integrated into a single machine, while in some other or similar embodiments, digital representation server 160, server machine 170 and/or server machine 180, as well as predictive server 112, can be integrated into a single machine.

In general, functions described in one implementation as being performed by digital representation server 160, server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
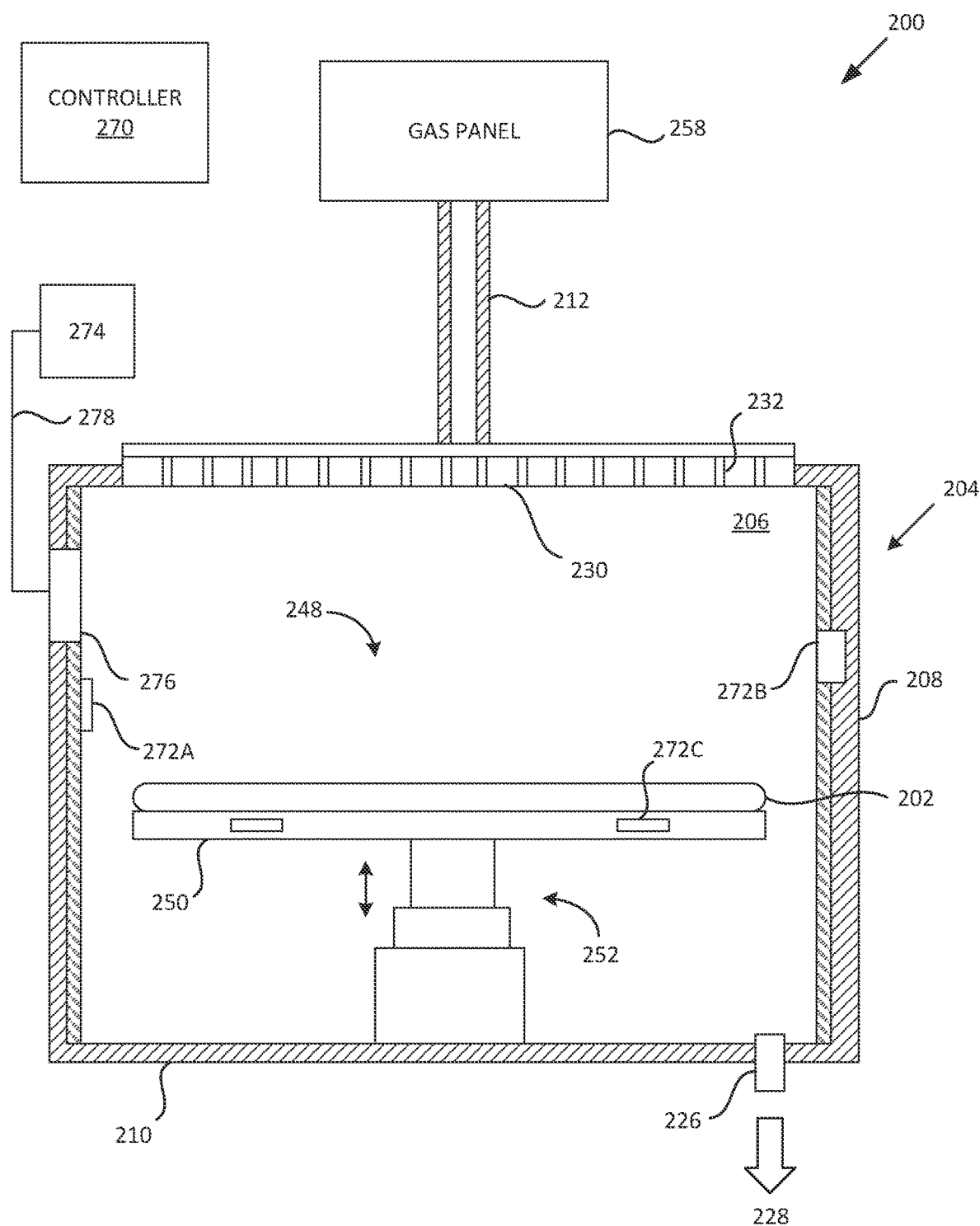
FIG. 2 is a cross-sectional schematic side view of an example process chamber of an example manufacturing system, according to aspects of the present disclosure.

FIG. 2 is a cross-sectional schematic side view of an example process chamber 200 of an example manufacturing system, according to aspects of the present disclosure. Process chamber 200 can be used for processes in which a corrosive plasma environment is provided. For example, the process chamber 200 can be a chamber for a plasma etcher or plasma etch reactor, and so forth. The plasma etcher or plasma etch reactor can etch away portions of one or more layers of materials deposited on a surface of a substrate 202, in accordance with an etch process recipe, in some embodiments. In another example, process chamber 200 can be a chamber for a deposition process. During a deposition process, process chamber 200 can deposit one or more layers of material on a surface of substrate 202, in accordance with a deposition process recipe, in some embodiments.

A substrate temperature control process, such as a substrate heating process or a substrate cooling process, can also be performed for substrate 202 before and/or after an etch process, a deposition process, etc. For example, a substrate heating process can be performed to heat one or more portions of substrate 202 to a target temperature (e.g., in accordance with a process recipe) before a deposition process or an etch process for substrate 202. Such substrate heating process is referred to as a substrate pre-heating process, in some embodiments. In another example, a substrate cooling process can be performed to cool one or more portions of substrate 202 to a target temperature (e.g., in accordance with a process recipe) after a deposition process or an etch process at process chamber 200.

In one embodiment, the process chamber 200 includes a chamber body 204 and a lid 230 that encloses an interior volume 206. In some embodiments, lid 230 can be or include a showerhead that includes a showerhead base and a showerhead gas distribution plate. Alternatively, the showerhead can be replaced by a nozzle in some embodiments, or by multiple pie shaped showerhead compartments and plasma generation units in other embodiments. The chamber body 204 can be fabricated from aluminum, stainless steel or other suitable material such as titanium (Ti). The chamber body 204 generally includes sidewalls 208 and a bottom 210. An exhaust port 226 can be defined in the chamber body 204, and can couple the interior volume 206 to a pump system 228. The pump system 228 can include one or more pumps and throttle valves utilized to evacuate and regulate the pressure of the interior volume 206 of process chamber 200.

In some embodiments, the lid 230 can be supported on the sidewall 208 of the chamber body 204 and a lid can be provided to enclose interior volume 206. The lid 230 can be opened to allow access to the interior volume 206 of the process chamber 200, and can provide a seal for the process chamber 200 while closed. A gas panel 258 can be coupled to the process chamber 200 (e.g., via gas line 212) to provide process and/or cleaning gases to the interior volume 206 through the lid (e.g., through apertures of the showerhead or through the nozzle). As illustrated in FIG. 2, lid 230 can be a showerhead that can include a gas distribution plate (GDP) and can have multiple gas delivery holes 232 (also referred to as channels) throughout the GDP.

A substrate support assembly 248 can be disposed in the interior volume 206 of the process chamber 200 below the lid 230. Substrate support assembly 248 generally includes at least a substrate support 250 and a shaft 252. The substrate support assembly 248 holds substrate 202 during processing. In some embodiments, the substrate support can be a vacuum chuck, an electrostatic chuck, a susceptor, or other workpiece support surface. In some embodiments, shaft 252 can be a motorized shaft that is configured to move substrate support 250 towards or away from lid 230. Further details regarding substrate support 250 and shaft 252 are provided with respect to FIGS. 3A-3D.

In some embodiments, one or more components of process chamber 200 can be coupled to a controller 270. System controller 270 can be and/or can include a computing device such as a personal computer, a server computer, a programmable logic controller (PLC), a microcontroller, and so on. Controller 270 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. Controller 270 can include a data storage device (e.g., one or more disk drives and/or solid state drives), a main memory, a static memory, a network interface, and/or other components.

Controller 270 can execute instructions to perform any one or more of the methodologies and/or embodiments described herein. In some embodiments, controller 270 can execute instructions to perform one or more operations at controller 270 in accordance with a process recipe. For example, controller 270 can be operatively coupled to a valve for a gas supply (not shown) coupled to process chamber 200 and can transmit a signal to the valve for the gas supply to cause a gas to flow or stop flowing into interior volume 206 of process chamber 200. In another example, controller 270 can be operatively coupled to a motorized component (not shown) for substrate support assembly 248 and can transmit a signal to the motorized component to cause the motorized component to move substrate support assembly 248 (and substrate 202) towards or away from lid 230. The instructions that are executable by controller 270 can stored on a computer readable storage medium, which can include the main memory, static memory, secondary storage and/or processing device (e.g., during execution of the instructions).

Process chamber 200 can include one or more sensors (e.g., sensors 272A, 272B, 272C, etc.) that are configured to capture data for substrate 202 and/or the environment within process chamber 200 (e.g., the environment of interior volume 206) before, during, or after a substrate process. As illustrated in FIG. 2, sensors 272A can be coupled to a surface of interior volume 206 of process chamber 200 (e.g., sidewall 208). Also illustrated in FIG. 2, sensors 272B can be embedded within sidewall 208. Although sensors 272A and 272B are illustrated as being coupled to or embedded within sidewall 208, it should be noted that sensors 272A and/or 272B can be coupled to or embedded within any surface of interior volume 206, such as bottom 210, one or more portions of lid 230, etc. In some embodiments, sensors 272A and/or sensors 272B can be, for example, temperature sensors, pressure sensors, humidity sensors, oxygen sensors, gas flow sensors, etc. that are configured to capture data for the environment within process chamber 200.

Sensors 272C can be embedded within one or more components disposed within process chamber 200. For example, as illustrated in FIG. 2, sensors 272C can be embedded within one or more portions of substrate support assembly 248. In some embodiments, sensors 272C can be configured to capture data associated with substrate 202, or one or more components coupled to or interfacing with substrate 202, before, during, or after a substrate process. For example, sensor 272C can be a temperature sensor configured to capture data associated with a temperature of substrate 202 and/or one or more heating elements of substrate support assembly 248 before, during, or after a substrate heating process at process chamber 200.

In some embodiments, controller 270 can receive data captured by sensors 272 before, during, or after the substrate process for substrate 202. For example, controller 270 can receive, temperature data, pressure data, humidity data, oxygen concentration data, gas flow data, etc. associated with substrate 202 and/or the environment within process chamber 200 during a substrate pre-heating process for substrate 202. Controller 270 can store the received sensor data at the storage medium that includes instructions that are executable by controller 270, in some embodiments. In additional or alternative embodiments, controller 270 can be communicatively coupled to a system controller (not shown) for a manufacturing system that includes process chamber 200. In such embodiments, controller 270 can, in some instances, transmit the sensor data received from sensors 272 to the system controller.

In some embodiments, a detection component 274 can be coupled (e.g., via an optical bundle 278) to a transparent window 276 embedded within a wall of process chamber 200. The detection component 274 can be or include a device that is configured to detect the presence of one or more materials within the environment of process chamber 200. For example, detection component 274 can be an optical detection device, such as a scanning electron microscope (SEM) device, that is configured to detect one or more optical signals for one or more materials included in interior volume 206. Detection component 274 can be communicatively coupled to controller 270, in some embodiments, and can transmit data associated with the one or more detected optical signals to controller 270, in accordance with previously described embodiments. Controller 270 can determine a type and/or an amount of particular materials within the environment of interior volume 206 based on the data associated with the one or more optical signals. In another example, detection component 274 can be a particle counter device that is configured to detect the presence of one or more particles and/or a size of particles on a surface of substrate 202 and/or within the environment of process chamber 200. Detection component 274 can capture data associated with the particles on a surface of substrate 202 and/or within the environment of process chamber 300 and can transmit the captured data to controller 270, in accordance with previously described embodiments.

Figure 3A:
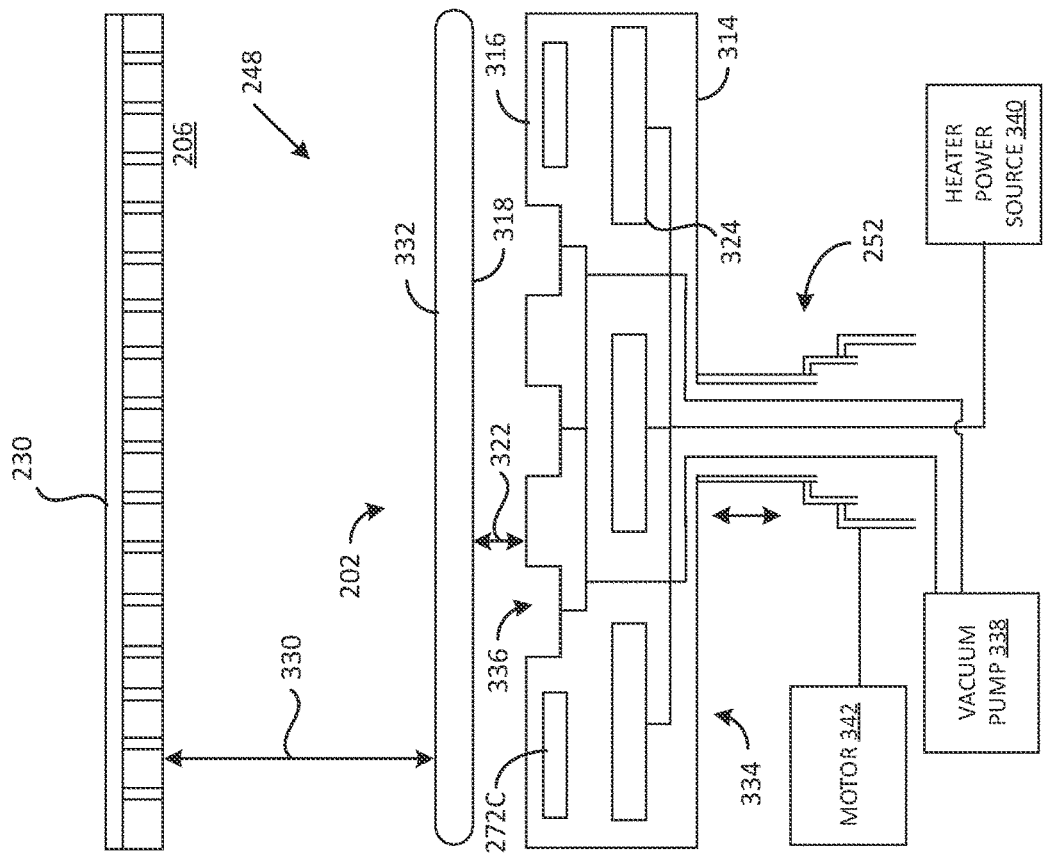
FIGS. 3A-3D each depict a cross-sectional schematic side view of an example substrate disposed on an example substrate support assembly, according to aspects of the present disclosure.

FIG. 3A is a cross-sectional schematic side view of an example substrate 202 disposed on an example substrate support assembly 248, according to aspects of the present disclosure. As described previously, substrate support assembly 248 can include a substrate support, which can be an electrostatic chuck 310, in some embodiments. Electrostatic chuck 310 can have a mounting surface 314 and a workpiece surface 316 opposite the mounting surface 314. Mounting surface 314 can be coupled (e.g., welded, fastened, etc.) to shaft 252. A bottom surface 318 of substrate 202 can interface with the workpiece surface 316 of electrostatic chuck 310.

In some embodiments, electrostatic chuck 310 can be composed of a dielectric body with one or more chucking electrodes 320 embedded within the dielectric body. Each chucking electrode 320 can be configured as a mono polar or bipolar electrode, or other suitable arrangement. A chucking electrode 320 can be coupled through an RF filter (not shown) to a chucking power source 312 which provides power (e.g., direct current (DC) power) to electrostatically secure the substrate 202 to the workpiece surface 316 of electrostatic chuck 310. As illustrated in FIG. 3A, shaft 252 can be a hollow shaft and one or more components (e.g., wires, etc.) that couple electrode(s) 320 to chucking power source 312 can be fed through shaft 252. In some embodiments, chucking power source 312 can be operatively coupled to a controller of process chamber 200, such as controller 270 described with respect to FIG. 2.

In some embodiments, a bottom surface 318 of substrate 202 can interface with the workpiece surface 316 of electrostatic chuck 310 when substrate 202 is secured to electrostatic chuck 310. In some embodiments, a gap 322 can exist between the bottom surface 318 of substrate 202 and the workpiece surface 316 that prevents bottom surface 318 from directly interfacing with workpiece surface 316. A size of gap 322 (i.e., a distance between bottom surface 318 and workpiece surface 316) can be significantly small, in some embodiments. For example, the size of gap 322 can between 1 micron and 10 microns. In some embodiments, the size of gap 322 can be dependent on an amount of electrostatic force that is provided by chucking electrode 320 to secure substrate 202 to electrostatic chuck 310. For example, the size of gap 322 can be small (e.g., 10 microns) when a large amount of electrostatic force is provided by chucking electrode 320 and the size of gap 322 can be larger (e.g., 100 microns) when a smaller amount of electrostatic force is provided by chucking electrode 320. In some embodiments, an amount of force provided by chucking electrode 320 can be dependent on an amount of power (e.g., DC power) provided to chucking electrode from chucking power source 312.

In some embodiments, controller 270 can cause the size of gap 322 to increase or decrease by controlling the amount of power provided to chucking electrode 320 from chucking power source 312. For example, controller 270 can transmit a signal to the chucking power source 312 to cause a large amount of power to be provided to chucking electrode 320, causing the size of gap 322 to be small. In another example, controller 270 can transmit a signal to chucking power source 312 to cause a small amount of power to be provided to chucking electrode 320, causing the size of gap 322 to be large. Please note that although a small amount of power can be provided to chucking electrode 320 to cause the size of gap 322 to be large, the amount of power can be enough to cause substrate 202 to be secured to electrostatic chuck 310.

Figure 3B:
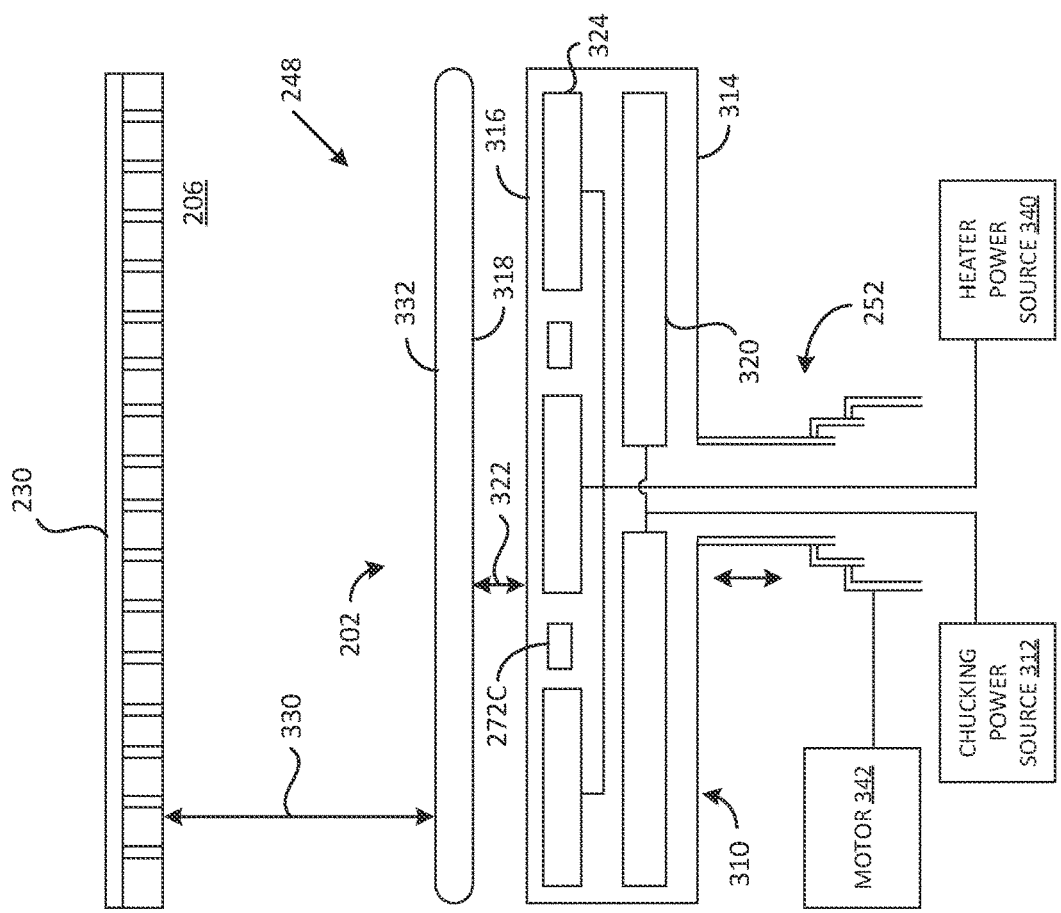

As described above, the substrate support 250 of substrate support assembly 248 can additionally or alternatively correspond to a vacuum chuck. FIG. 3B is a cross-sectional schematic side view of an example substrate 202 disposed on an example substrate support assembly 248 that includes a vacuum chuck 334, according to some aspects of the present disclosure. Vacuum chuck 334 can include a mounting surface 314 and a workpiece surface 316, as described previously. Mounting surface 314 can be coupled to shaft 252, in accordance with previously described embodiments. The workpiece surface 316 of vacuum chuck 334 can interface with bottom surface 318 of substrate 202, as previously described. The workpiece surface 316 of vacuum chuck 334 can include one or more protrusions 336 that create gap 322 between bottom surface 318 of substrate 202 and the workpiece surface 316 of vacuum chuck 334. One or more channels can be formed on the workpiece surface 316 of vacuum chuck 334, where each channel is configured to connect a protrusion 336 to a vacuum pump 338. In some embodiments, the one or more channels are connected to vacuum pump 338 via one or more components that are fed through shaft 252, in accordance with previously described embodiments. Vacuum pump 338 can generate reduced pressure (referred to as vacuum pressure) in the gap 322, causing substrate 202 to be secured to vacuum chuck 334.

In some embodiments, the amount of vacuum pressure generated in gap 322 can affect the thermal coupling between substrate 202 and vacuum chuck 334. For example, the thermal conductivity of the gas at gap 322 can change based on the amount of vacuum pressure generated in gap 322 by vacuum pump 338. The thermal conductivity of the gas can impact the thermal coupling between substrate 202. In some embodiments, controller 270 can control the thermal conductivity of the gas at gap 322 (and therefore the thermal coupling between substrate 202 and vacuum chuck 334) by controlling the amount of vacuum pressure generated in gap 322 by vacuum pump 338. For example, controller 270 can transmit a signal to vacuum pump 338 to cause a small amount of vacuum pressure to be generated in gap 322, causing the thermal conductivity of the gas at gap 322 to be small. In another example, controller 270 can transmit a signal to vacuum pump 338 to cause a larger amount of vacuum pressure to be generated in gap 322, causing the thermal conductivity of the gas at gap 322 to be large.

In some embodiments, the electrostatic chuck 310 and/or vacuum chuck 334 can include one or more components for heating substrate 202. For example, one or more heating elements 324 can be embedded into a body of electrostatic chuck 310 and/or vacuum chuck 334. Heating elements 324 can include one or more main resistive heating elements and/or one or more auxiliary heating elements. The main resistive heating elements can be configured to elevate the temperature of electrostatic chuck 310 and/or vacuum chuck 334 and the supported substrate 202 to a target temperature (e.g., a temperature specified in a process recipe). The auxiliary heating elements can be configured to provide localized adjustments to the temperature profile of electrostatic chuck 310 and/or vacuum chuck 334 generated by the main resistive heating elements. Thus, the main resistive heating elements operate on a globalized macro scale while the auxiliary heating elements can operate on a localized micro scale. Heating elements 324 can be coupled to a switching module (not shown) that includes one or more switching devices. The switching module can be coupled through an RF filter to a heater power source 340. The switching devices in the switching module switch on and off the flow of power to the heating elements 324 based on signals received from controller 270. In some embodiments, heater power source 340 can provide up to 900 watts or more power to heating elements 324.

In additional or alternative embodiments, substrate support assembly 248 can also include one or more components for cooling substrate 202. For example, one or more cooling channels (not shown) can be disposed within the body of electrostatic chuck 310 and/or vacuum chuck 334. Cooling liquid or gas (e.g., air, water, glycol, a combination thereof, etc.) can be provided to the one or more cooling channels via a cooling fluid supply. In some embodiments, controller 270 can transmit a signal to the cooling fluid supply to cause a particular amount of cooling fluid to be flowed through the one or more cooling channels. The particular amount of cooling fluid can be a target amount of cooling fluid that to reduce the temperature of electrostatic chuck 310 and/or vacuum chuck 334 and the supported substrate 202 to a target temperature (e.g., a temperature specified in a process recipe).

As described above, substrate support assembly 248 can be disposed in the interior volume 206 of the process chamber 200 below lid 230. A gap 330 can exist between lid 230 of process chamber and a top surface 332 of substrate 202. The size of gap 330 (i.e., the distance between lid 230 and top surface 332) can be dependent on a position of electrostatic chuck 310 and/or vacuum chuck 334 within process chamber 200. As illustrated in FIGS. 3A and 3B, shaft 252 can, in some embodiments, be an extendable or a telescopeable shaft that is configured to extend electrostatic chuck 310 and/or vacuum chuck 334 (with or without substrate 202) towards or away from lid 230. Shaft 252 can be coupled to a motor 342 that is configured to cause shaft 252 to extend electrostatic chuck 310 and/or vacuum chuck 334 towards or away from lid 230. Controller 270, in some embodiments, can be coupled to motor 342, in some embodiments. Controller 270 can transmit a signal to motor 342 to cause shaft 252 to extend electrostatic chuck 310 and/or vacuum chuck 334 from an initial position to another position closer to lid 230. The size of gap 330 decreases as electrostatic chuck 310 and/or vacuum chuck 334 is moved to the position closer to lid 230. In another example, controller 270 can transmit a signal to motor 342 to cause shaft 252 to retract electrostatic chuck 310 and/or vacuum chuck 334 from an initial position to another position farther from lid 230. The size of gap 330 increases as electrostatic chuck 310 and/or vacuum chuck 334 is moved to the position closer to lid 230.

Figure 3C:
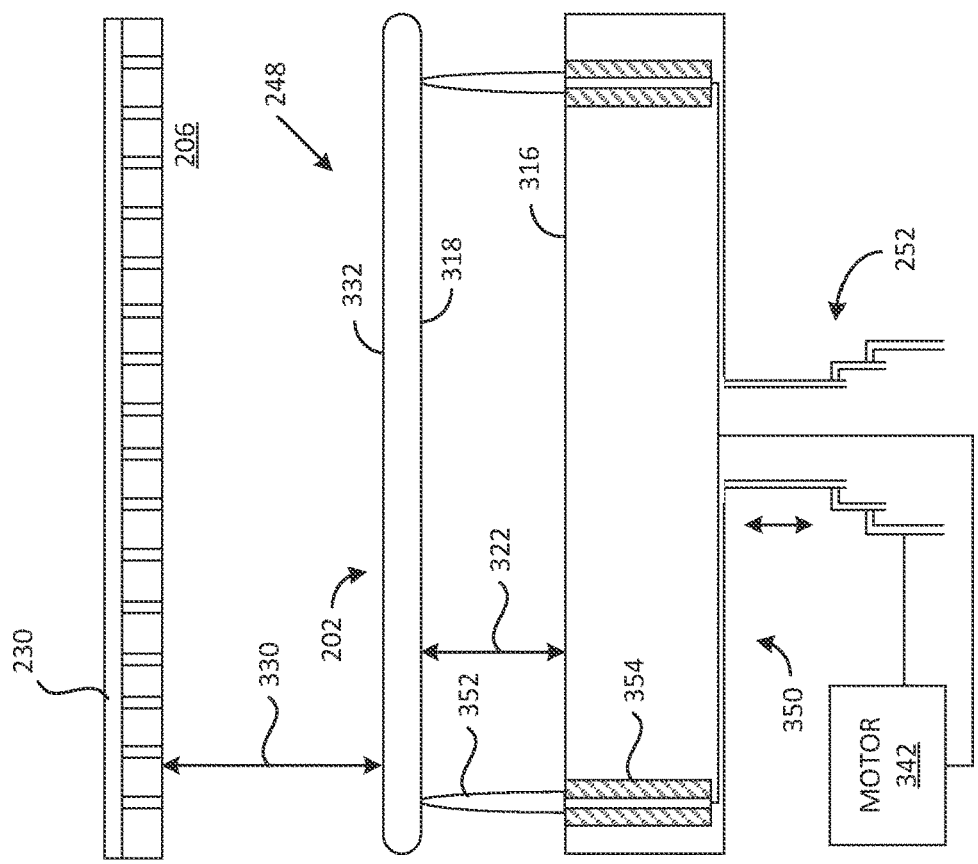
Figure 3D:
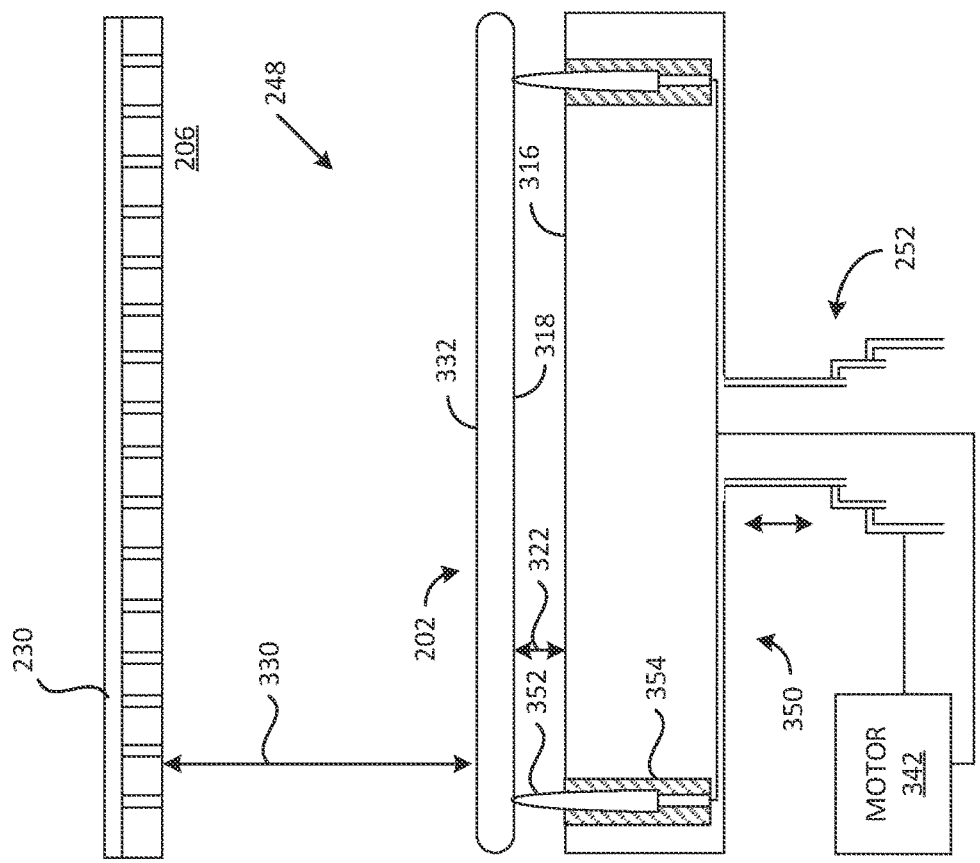

FIGS. 3C-3D depict a cross-sectional schematic side view of another example substrate 202 disposed on another example substrate support assembly 248, according to aspects of the present disclosure. In some embodiments, substrate 202 can be disposed on a workpiece surface 316 of a substrate support 350 of substrate support assembly 248. As illustrated in FIGS. 3C-3D, substrate support 350 can include one or more pins 352 that are configured to secure substrate 202 to substrate support 350. In some embodiments, pins 352 are configured to engage with one or more receptacles (not shown) of substrate 202. Pins 352 can be retractable pins that are configured to retract into or extend out of respective channels 354 of the body of substrate support 350. In some embodiments, each pin 352 can be coupled to motor 342 (or to another motor for substrate support assembly 248). Motor 342 can cause pins 352 to retract into or extend out of a respective channel 354 of substrate support 350 while engaged with substrate 202.

In an illustrative example, each of the one or more pins 352 supporting substrate 202 can be partially extended from a respective channel 354 of substrate support 350. As illustrated in FIG. 3C, a portion of each pin 352 is exposed to the environment of interior volume 206 of process chamber 200 and another portion of each pin 352 can be disposed within a respective channel 354 of substrate support 350, causing substrate 202 to be disposed at a first position with respect to substrate support 250. Controller 270 can transmit a signal to motor 342 to extend the one or more pins 352 out of the substrate support 350. As illustrated in FIG. 3D, as motor 342 extends the one or more pins 352 out of substrate support 350, the portion of each pin 352 that is exposed to the interior volume 206 is increased and the portion of each pin 352 that is disposed within the respective channel 354 of substrate support 350 is decreased. Responsive to motor 342 extending the one or more pins 452 out of the substrate support 350, substrate 202 can be disposed at a second position with respect to substrate support 202. As illustrated in FIGS. 3C and 3D, substrate 302 can be closer to lid 230 at the second position than at the first position.

As described previously, gap 322 can exist between the bottom surface 318 of substrate 202 and workpiece surface 316 of substrate support 350. The size of gap 322 can be dependent on the position of substrate 202 supported by pins 352. For example, the size of gap 322 can be larger when pins 352 supporting substrate 202 are fully extended (i.e., the entire portion of each pin 352 is exposed to the environment of interior volume 206), as illustrated in FIG. 3D, than when pins 352 are partially extended (i.e., less than the entire portion of each pin 352 is exposed to the environment of interior volume 206), as illustrated in FIG. 3C or fully retracted (i.e., the entire portion of each pin 352 is disposed within a respective channel 354 of substrate support 350).

Gap 330 can exist between lid 230 and a top surface 332 of substrate 202, as previously described. The size of gap 330 can be dependent on a position of substrate support 350 relative to lid 230, in accordance with previously described embodiments. In additional or alternative embodiments, the size of gap 330 can be further dependent on a position of substrate 202 supported by pins 352. In accordance with the previously provided example, the size of gap 322 can be larger when pins 352 supporting substrate 202 are fully extended than when pins 352 are partially extended or fully retracted. However, the size of gap 330 can be smaller when pins 352 are fully extended than when pins 352 are partially extended or fully retracted.

In some embodiments, controller 270 can cause a gas to flow into one or more portions of interior volume 206 of process chamber 200. For example, controller 270 can cause a gas to flow into the space of gap 322 (i.e., between the bottom surface 318 of substrate 202 and the workpiece surface 316 of substrate support 350). In some embodiments, controller 270 can control a temperature of the gas before or as the gas is flowed into interior volume 206. For example, controller 270 can be coupled to a heating element coupled to a gas line for the gas and can generate and transmit a signal to cause the temperature of the heating element to increase or decrease. As the gas flows past the heating element, the temperature of the gas can accordingly increase or decrease. Controller 270 can use the temperature-controlled gas to increase or decrease a temperature of substrate 302, in some embodiments. For example, controller 270 can cause gas flowing into gap 322 to be heated to a particular temperature that is configured to heat or cool substrate 202 to a target temperature (i.e., in accordance to a substrate heating process recipe or a substrate cooling process recipe). In additional or alternative embodiments, controller 270 can cause a gas to flow into one or more portions of the space of gap 330 to cause a temperature of substrate 302 to be heated or cooled to the target temperature.

Gap 322, described with respect to FIGS. 3A-3D, can correspond to a portion of the environment of interior volume 206 in a space between a bottom surface of substrate 202 and workpiece surface 316 (i.e., of electrostatic chuck 310, vacuum chuck 334, and/or substrate support 350). Gap 330 can correspond to a portion of the environment of interior volume 206 in a space between the lid 230 and a top surface 332 of substrate 303. In some embodiments, the environment of interior volume 206 at gap 322 can be different from the environment of interior volume 206 at gap 330. For example, a pressure of the environment of interior volume 206 at gap 322 can be less than a pressure of the environment of interior volume 206 at gap 330. In some instances, the difference in pressure between the environments at gap 322 and at gap 330 can correspond to a downforce pressure that is applied to substrate 202. In some embodiments, the amount of downforce pressure that is applied to substrate 202 can impact a scratch profile for the bottom surface 318 of substrate 202 during or after a substrate process (e.g., a substrate heating process, a substrate cooling process, etc.). For example, a significant number of scratches can be made on the bottom surface 318 of substrate 202 when a large amount of downforce pressure is applied to substrate 202 during the substrate process. In another example, the scratches made on the bottom surface 318 of substrate 202 can be deeper when a large amount of downforce pressure is applied to substrate 202.

Figure 4:
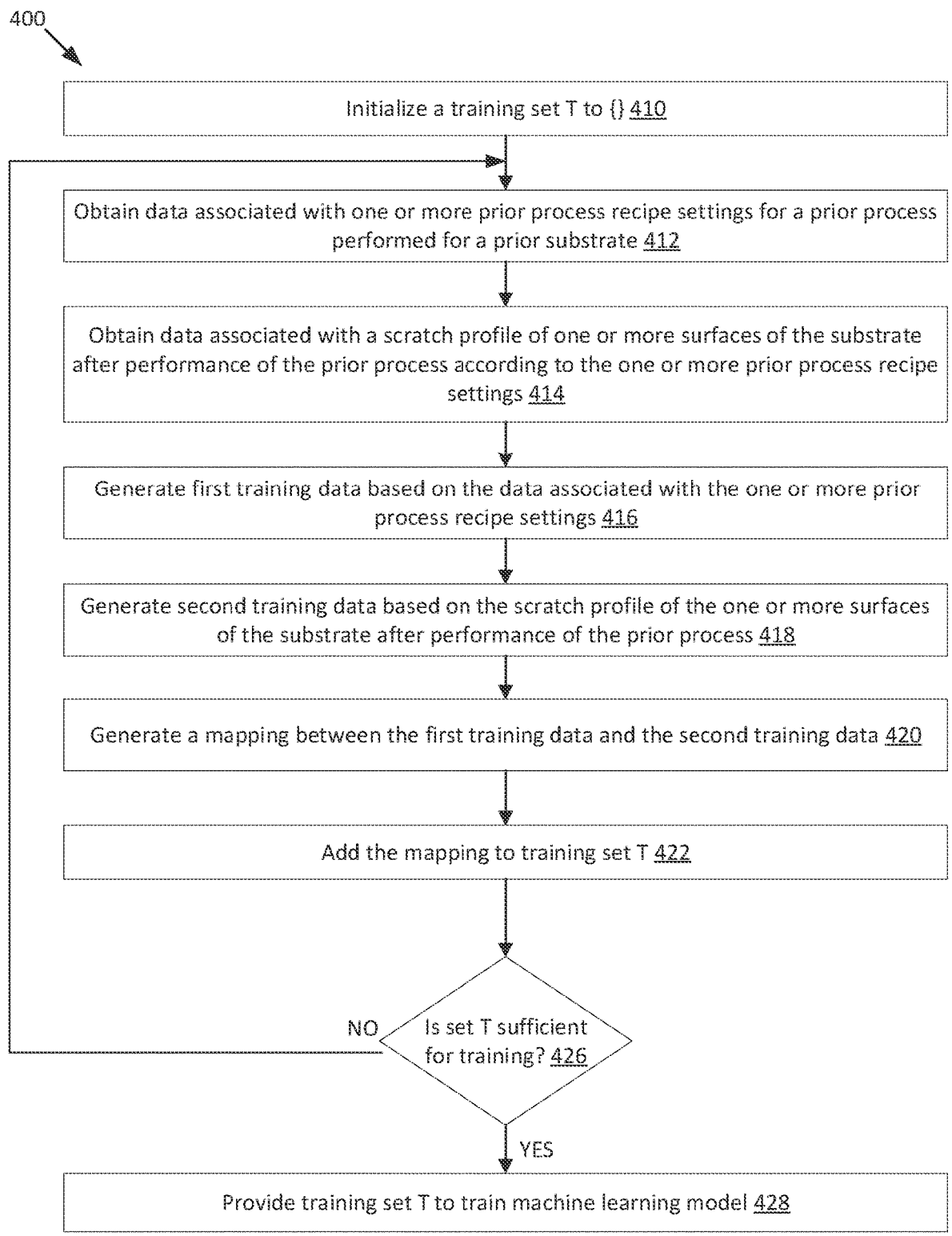
FIG. 4 is a flow chart of a method for training a machine learning model to predict process recipe settings for a substrate temperature control process, according to aspects of the present disclosure.

FIG. 4 is a flow chart of a method 400 for training a machine learning model to predict process recipe settings for a substrate temperature control process, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by training set generator 172 of server machine 170.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 410, processing logic initializes a training set T to an empty set (e.g. { }). At block 412, processing logic obtains data associated with one or more prior process recipe settings for a prior process performed for a prior substrate. In some embodiments, the prior process can be a process performed for the prior substrate at a process chamber of manufacturing equipment 124. For example, the prior substrate can be placed at process chamber 200 (e.g., by a robot of manufacturing equipment 124, by an operator of manufacturing equipment 124, etc.) and a substrate temperature control process can be performed for the prior substrate at process chamber 200 according to a substrate temperature control process recipe.

Controller 270 can perform the prior process for substrate 202 by executing one or more instructions associated with the process recipe for the prior process. In some embodiments, the process recipe can include one or more process recipe settings and controller 270 can execute the one or more instructions associated with the process recipe in accordance with the one or more process recipe settings. For example, for a substrate at an initial temperature of approximately 50 degrees Celsius (° C.), a first setting for a substrate heating process can provide that an overall length of the substrate heating process is to be approximately 50 seconds. A second setting for the substrate heating process can provide that a final temperature for the substrate is to be approximately 100° C. Accordingly, controller 270 can execute one or more instructions such that one or more components (e.g., heating elements 324) of process chamber 200 heat substrate 202 (i.e., from the initial temperature of approximately 50° C.) to the temperature of approximately 100° C. at approximately 50 seconds after controller 270 initiates the substrate heating process.

In some embodiments, one or more process recipe settings can be settings for the overall substrate process. In other or similar embodiments, one or more process recipe settings can be settings for one or more particular operations of the substrate process. In accordance with the previous example, one or more settings for a first operation of the substrate heating process can provide that a temperature of substrate 202 is to be heated to a temperature of 60° C. at approximately 10 seconds after controller 270 initiates the substrate heating process. One or more settings for a second operation of the substrate heating process can provide that the temperature of substrate 202 is to be heated to a temperature of 70° C. at approximately 20 seconds after controller 270 initiates the substrate heating process. The settings for other operations of the substrate heating process can provide that the temperature of substrate 202 be increased by 10° C. for each 10 second period of the substrate heating process until the temperature of the substrate 202 reaches the final temperature at approximately 50 seconds after controller 270 initiates the substrate heating process.

In some embodiments, a setting for the overall substrate process can include a setting for an overall length of a time period for the substrate process (referred to herein as process length), a temperature of substrate 202 at the end of the substrate process, a setting for a temperature of substrate support 250 and/or substrate support assembly 248 at the end of the substrate process, a pressure of the environment of one or more portions of interior volume 206 (e.g., at gap 322, at gap 330, etc.) at the end of the substrate process, a setting for a position of substrate 202 relative to substrate support 250 (e.g., a size of gap 322) at the end of the substrate process, a setting for a position of substrate 202 and/or substrate support 250 relative to the lid 230 at the end of substrate process, a setting for an amount, a temperature, a pressure, etc. of one or more types of gas flowed into interior volume 206 (e.g., at gap 322 and/or at gap 330) at the end of the substrate process, and so forth. A setting for one or more particular operations of the process recipe can include a setting for a length of a time period of the particular operation (referred to herein as operation length), a setting for a temperature of substrate 202 during and/or at the end of the particular operation, a setting a pressure of the environment of interior volume 206 at gap 322 and/or at gap 330 during and/or at the end of the particular operation, a setting for an amount, a temperature, a pressure, etc. of a particular gas flowed into interior volume 206 at gap 322 and/or at gap 330 during and/or at the end of the particular operation(s), and so forth.

In additional or alternative embodiments, the prior process can correspond to a substrate process simulated by a digital replica of process chamber 200. As described above, a digital replica of process chamber 200 can be an algorithmic model that simulates process the physical elements and dynamics of process chamber 200. Data associated with a substrate process can be provided as an input to the digital replica and the digital replica can run a simulation of the substrate process performed according to one or more process recipes. In some embodiments, the data associated with the substrate process can include data associated with properties of one or more components of a process chamber that is simulated by the digital replica. For example, the data can include an emissivity of a component (i.e., a measure of the component's ability to emit energy), a molecular weight of the component, etc. The data can additionally or alternatively include, in some embodiments, data associated with properties of one or more portions of the substrate simulated by the digital replica. For example, the data can include an emissivity of a top surface of the substrate, an emissivity of the bottom surface of the substrate, a molecular weight of the substrate, etc.

In some embodiments, data associated with the substrate process can additionally or alternatively include one or more settings associated with the simulated substrate process. The one or more settings can include simulation settings and/or process recipe settings. Simulation settings refer to one or more settings associated with an initial state of a simulated substrate and/or one or more components of the simulated process chamber. For example, a simulation setting for a simulated lid of the simulated process chamber can set an initial temperature of the simulated lid to approximately 65° C. As the digital replica simulates an initial operation of the substrate process, the temperature for the simulated lid can be associated with a temperature of approximately 65° C. The temperature for the simulated lid can increase or decrease during subsequent operations of the simulated substrate process, in some embodiments. In another example, a simulation setting for the simulated substrate can set an initial temperature of the simulated substrate to approximately 50° C. Accordingly, the initial temperature for the simulated substrate at an initial period of the simulated substrate process can be associated with a temperature of approximately 50° C. and the temperature of the simulated substrate process can increase or decrease in accordance with the one or more substrate process settings of the simulated process. The one or more substrate process recipe settings associated with one or more simulated process recipe operations can include one or more settings associated with an overall substrate process or one or more particular operations of the substrate process.

As described above, at block 412, processing logic can obtain data associated with one or more process recipe settings for the prior process performed for the prior substrate. The one or more process recipe settings can be process recipe settings for a physical process performed for substrate 202 at process chamber 200 and/or process recipe settings for a simulated process performed for a simulated substrate process by a digital replica of a process chamber, in accordance with previously provided embodiments. In some embodiments, processing logic can obtain the data associated with the one or more process recipe settings from data store 140, described with respect to FIG. 1.

At block 414, processing logic obtains data associated with a scratch profile (e.g., a number of scratches, a depth of the scratches, and/or a length of the scratches) of one or more surfaces of substrate 202 or the simulated substrate after performance of the prior process according to the one or more prior process recipe settings. Processing logic can obtain the data associated with the scratch profile by retrieving the data from data store 140, in accordance with previously described embodiments. The data associated with the scratch profile can be generated based on data collected by one or more components of process chamber 200, data generated by metrology equipment 128, and/or data provided as an output of a simulation of a process recipe by the digital replica. Further details regarding the generation of data associated with the scratch profile for one or more surfaces of substrate 202 and/or the simulated substrate are provided herein.

In some embodiments, data associated with the scratch profile for the one or more surfaces of substrate 202 can correspond to data generated by detection component 274 described with respect to FIG. 2. As described previously, detection component 274 can be a particle counter device that is configured to detect the presence of one or more particles and/or a size of particles on a surface of substrate 202 and/or within the environment of process chamber 200. Controller 270 can receive data associated with the number and/or size of particles from detection component 274 before, during, and/or after the substrate process performed at process chamber 200. Controller 270 can generate data associated with the scratch profile of the one or more surfaces of substrate 202 based on the data received from detection component 274. For example, controller 270 can generate data associated with the scratch profile of a bottom surface 318 of substrate 202 based on a number of particles and/or the size of the particles that were generated during the substrate process at process chamber (i.e., in view of a difference in the number of particles present in the chamber before initiation of the substrate process and the number of particles present in the chamber after completion of the substrate process). Controller 270 can transmit the data associated with the scratch profile to the system controller for the manufacturing system and the system controller can store the data at data store 140, in accordance with previously described embodiments.

In other or similar embodiments, data associated with the scratch profile of the one or more surfaces of substrate 202 can be generated based on data collected by one or more sensors (e.g., sensors 272A-C) at process chamber 200. As described previously, the amount of downforce that is applied to substrate 202 during a substrate process can impact a scratch profile for the bottom surface 318 of substrate 202. Accordingly, data associated with the amount of downforce applied to substrate 202 can correspond to the scratch profile for bottom surface 318. One or more sensors 272 at process chamber 200 can collect data associated with a pressure of an environment of interior volume 206 at gap 322 and/or 330 before, during, or after completion of the substrate process for 202. Controller 270 can determine, based on the collected data, an average downforce applied to substrate 202 during the substrate process and/or a downforce applied to substrate 202 during one or more particular operations of the substrate process. Controller 270 can transmit the data to the system controller for storage at data store, in accordance with previously described embodiments.

In some embodiments, a rate that a temperature of substrate 202 changes during the substrate process (referred to as the substrate ramping rate) can additionally or alternatively impact the scratch profile for the bottom surface 318 of substrate 202. For example, a temperature of substrate 202 can be approximately 30° C. prior to initiation of the substrate process at process chamber 200. An initial operation of the process recipe for the substrate process includes one or more settings to rapidly increase the temperature of substrate 202 in a short time period (e.g., increase the temperature of substrate 202 to 80° C. within 10 seconds after initiating the substrate process). The rapid increase of the temperature of substrate 202 can cause a material (e.g., silicon, etc.) to rapidly expand. The rapid expansion of the material of substrate 202 can cause an increased number of scratches and/or an increased length of the scratches on the bottom surface 318 of substrate 202 than if the material of substrate 202 is expanded at a slower rate (i.e., the increase of the temperature of substrate 202 is increased to 80° C. within 40 seconds after initiating the substrate process.

One or more sensors 272 at process chamber 200 can collect data associated with a temperature of substrate 202, a temperature of one or more components of substrate support assembly 248 (e.g., heating elements 324, and/or a temperature of one or more portions (e.g., at gap 322 and/or gap 330) of an environment of interior volume 206 before, during, or after completion of the substrate process for substrate 202. Controller 270 can determine, based on the collected data, a ramping rate for a temperature of substrate 202 and/or rate of expansion for the material of substrate 202 during the overall substrate process and/or during one or more particular operations of the substrate process. Controller 270 can transmit the data to the system controller for storage at data store, in accordance with previously described embodiments.

As described above, in some embodiments, data associated with the scratch profile of one or more surfaces of the substrate can be generated by metrology equipment 128. For example, substrate 202 can be placed at metrology equipment 128 prior to a substrate process at process chamber 200 and metrology equipment 128 can generate data associated with a scratch profile of one or more surfaces of substrate 202 (referred to as a pre-process scratch profile). The data associated with the pre-process scratch profile can include a number of scratches, a depth of the scratches, and/or a length of the scratches on the one or more surfaces of substrate 202 before the substrate process 202. After completion of the substrate process at process chamber 200, substrate 202 can be placed at metrology equipment 128 and metrology equipment 128 can generate data associated with the scratch profile of the one or more surfaces of substrate 202 (referred to as the post-process scratch profile). Metrology equipment 128 can store the pre-process scratch profile and/or the post-process scratch profile at data store 140, in some embodiments. The scratch profile of the one or more surfaces of substrate 202 associated with the substrate process can correspond to a difference between the pre-process scratch profile and the post-process scratch profile obtained by metrology equipment 128.

As described previously, the digital replica of a process chamber can simulate one or more substrate processes for a simulated substrate. An output of the digital replica can include data associated with the environment of the simulated process chamber and/or the simulated substrate before, during, or after completion of the simulated one or more substrate processes. In some embodiments, an output of the digital replica can include data associated with the scratch profile of one or more surfaces of the simulated substrate. For example, an output of the digital replica can include data associated with a number of scratches, a depth of the scratches, and/or the length of the scratches on one or more surfaces of the simulated substrate after completion of the simulated substrate process. In another example, the output of the digital replica can include data associated with a downforce applied to the simulated substrate, a ramping rate for a temperature of the simulated substrate, and/or a rate of expansion of a material of the simulated substrate. In yet another example, the output of the digital replica can include data associated with a number of particles and/or a size of the particles generated at the simulated process chamber during the simulated substrate process. In some embodiments, the output of the digital replica can be stored at data store 140. Accordingly, processing logic can obtain the data associated with the scratch profile for the simulated substrate from data store 140, as previously described. In other or similar embodiments, the output of the digital replica can be stored at memory for digital representation server 160.

Processing logic can obtain the data associated with the scratch profile for the simulated substrate from digital representation server 160, in such embodiments.

Figure 5B:
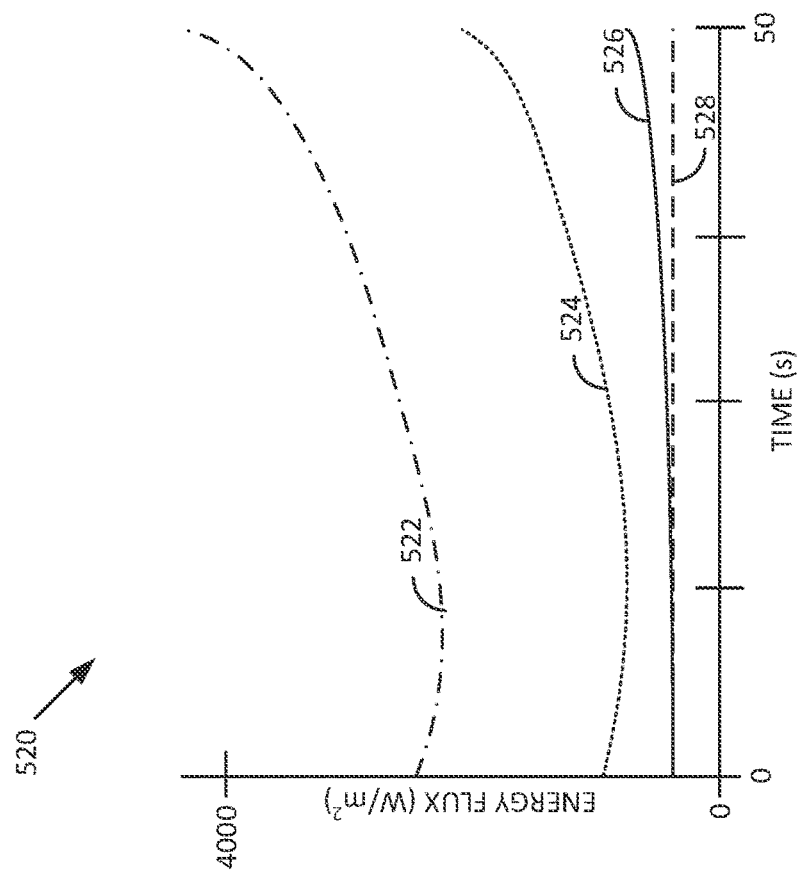
FIGS. 5A-5B illustrate an example simulation of a substrate process for a simulated substrate at a simulated process chamber, according to aspects of the present disclosure.
Figure 5A:
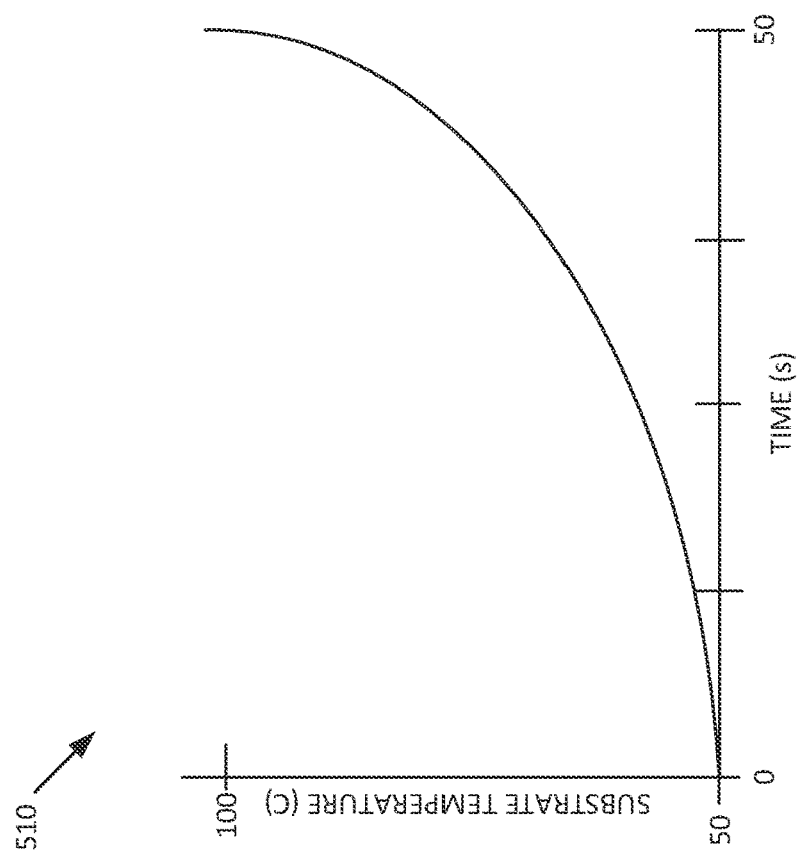

FIGS. 5A-5B illustrate an example simulation of a substrate process for a simulated substrate at a simulated process chamber, according to aspects of the present disclosure. In some embodiments, the simulation of the substrate process can be performed in accordance with one or more simulated process settings and one or more simulated process chamber properties. A simulated process recipe settings can include simulation settings associated with one or more components of the simulated process chamber and/or the simulated substrate. For example, a simulated process setting can include simulation settings such as a simulation setting for an initial temperature of a simulated substrate , a simulation setting for an initial temperature of the substrate support assembly, a simulation setting for a pressure for an environment of the simulated process chamber, etc. In some embodiments, simulated process settings 512 can also include simulated process recipe settings associated with one or more operations of the simulated process for the simulated substrate. For example, simulated process settings can include simulated process recipe settings such as an overall process length setting, a substrate final temperature setting), a substrate support assembly final temperature setting, a setting for a distance between the simulated substrate and the simulated substrate support assembly, a setting for a distance between the simulated substrate and the simulated lid of the simulated process chamber, etc.

In some embodiments, the simulation of the substrate process can also be performed in view of property data associated with the simulated process chamber, as described previously. The simulated process chamber property data can include property data associated with the simulated substrate and/or one or more components of the simulated process chamber. For example, the simulated process chamber property data can include, for the simulated process chamber, an emissivity for one or more components of the process chamber and/or the substrate. As described previously, processing logic (e.g., processing logic executing one or more operations of method 400 described with respect to FIG. 4) can provide simulated process recipe settings and/or simulated process chamber property data as input to the digital replica to run the simulation of the substrate process for the simulated substrate at the simulated process chamber. FIGS. 5A-5B illustrate example data obtained from the simulation by the digital replica of the process chamber, according to aspects of the present disclosure. FIG. 5A depicts an example graph 510 including data associated with a ramping rate of a temperature of the simulated substrate during time periods of the simulated substrate process. As illustrated in FIG. 5A, a temperature for the simulated substrate is approximately 50° C. at an initial time period of the simulated substrate process. During the course simulated substrate process (e.g., approximately 50 s), the temperature of the simulated substrate increases (at a non-linear rate) to a temperature of approximately 100° C. FIG. 5B depicts another example graph 520 including data associated with an amount of energy flux between the simulated substrate and one or more components of the simulated process chamber. In some embodiments, the amount of energy flux between the simulated substrate and the one or more components of the simulated process chamber can correspond to an amount of pressure in the environment between the two or more components. For example, line 522 of graph 520 represents and amount of conduction energy flux between the simulated substrate and the substrate support assembly of the simulated process chamber, line 524 represents an amount of conduction energy flux between the simulated substrate and the lid of the simulated process chamber, line 526 represents an amount of radiation energy flux between the simulated substrate and the simulated substrate support assembly, and line 528 represents and amount of radiation energy flux between the simulated substrate and the simulated lid.

In some embodiments, the digital replica of the process chamber can provide the data indicated in graphs 510 and/or 520 as an output of the simulated substrate process. As described previously, the data indicated in graphs 510 and/or 520 can correspond to data for a scratch profile of the simulated substrate. In other or similar embodiments, the digital replica of the process chamber can provide other data associated with the scratch profile for the simulated substrate as an output of the simulated substrate process. For example, the digital replica of the process chamber can provide an indication of a number of scratches, a depth of the scratches, and/or a length of the scratches on one or more surfaces of the simulated substrate after completion of the simulated substrate process.

Referring back to FIG. 4, at block 416, processing logic generates first training data based on the data associated with the one or more prior process recipe settings. In some embodiments, processing logic can generate the first training data based on the data associated with the prior process recipe settings for the prior process performed for substrate 202 at process chamber 200, as described previously. In other or similar embodiments, processing logic can generate the first training data based on the data associated with the process recipe settings for the substrate process simulated by digital replica, as previously described.

In some embodiments, processing logic can further generate the first training data based on additional data associated with the prior substrate process performed for the substrate (i.e., substrate 202 or the simulated substrate). For example, processing logic can further generate the first training data based data associated with one or more components of process chamber 200 and/or substrate 202 before the substrate process was initiated at process chamber 200. Such data can include, but is not limited to, a temperature of the substrate, the substrate support assembly, and/or the lid of process chamber 200 before initiation of the substrate process, a pressure of the an environment of one or more portions (e.g., at gap 322, at gap 330, etc.) of the interior volume 206 of process chamber 200 before initiation of the substrate process, etc. In another example, processing logic can further generate the first training data based on the simulation settings provided as input to the digital replica for the simulated substrate process, as described previously.

At block 418, processing logic generates second training data based on the scratch profile of the one or more surfaces of the substrate after performance of the prior process. In some embodiments, processing logic can generate the second training data based on the scratch profile data stored at data store 140, as described previously. In additional or alternative embodiments, processing logic can generate the second training data based on the scratch profile data generated by digital representation server 160, as described previously. At block 420, processing logic generates a mapping between the first training data and the second training data. At block 422, processing logic adds the mapping to training set T.

At block 424, processing logic determines whether the training set, T, includes a sufficient amount of training data to train a machine learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine learning model, method 400 returns to block 412. Responsive to determining the training set, T, includes a sufficient amount of training data to train the machine learning model, method 400 continues to block 426.

At block 426, processing logic provides training set T to train the machine learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 426, machine learning model 190 can be used to predict one or more process recipe settings that correspond to a target scratch profile for a current substrate to be processed at a process chamber, in accordance with embodiments described herein.

Figure 6:
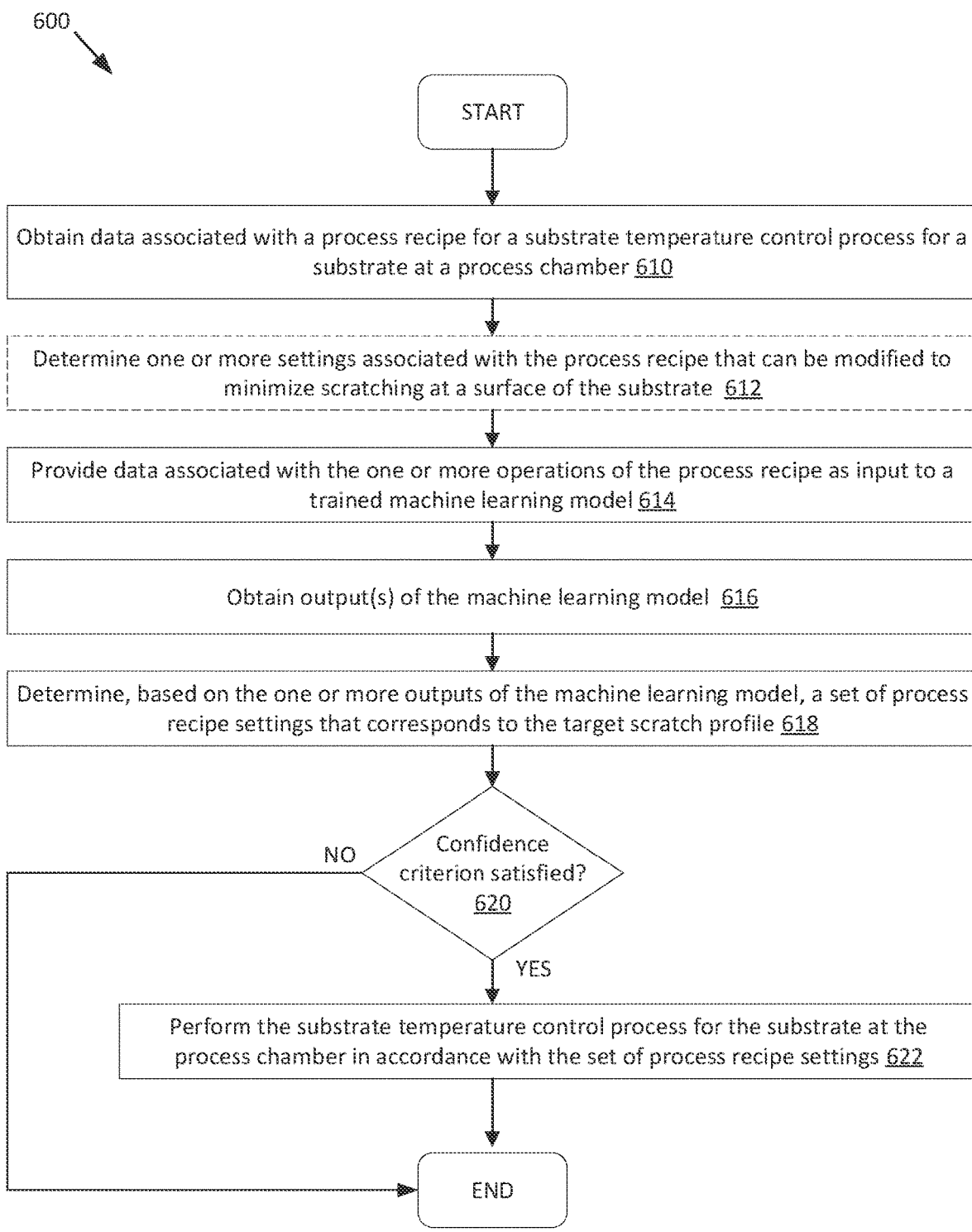
FIG. 6 is a flow chart of a method for obtaining process recipe settings for reducing substrate surface scratching, according to aspects of the present disclosure.

FIG. 6 is a flow chart of a method for obtaining process recipe settings for reducing substrate surface scratching, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 100 of FIG. 1. In other or similar implementations, one or more operations of method 600 can be performed by one or more other machines not depicted in the figures. In some aspects, one or more operations of method 600 can be performed by predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 610, processing logic can obtain data associated with a process recipe for a substrate temperature control process to be performed for a substrate at a process chamber. In some embodiments, the substrate can correspond to substrate 202 and the process chamber can correspond to process chamber 200, described with respect to FIG. 2. The data associated with the process recipe can include an indication of one or more operations to be performed for substrate 202 during the substrate process, in some embodiments. In some embodiments, the data can additionally or alternatively include an indication of one or more settings associated with the overall substrate process. For example, the data can include a setting for the overall process length, a setting for the final substrate temperature, a setting for the final temperature of the substrate support assembly 248, etc. In other or similar embodiments, the data can include an indication of one or more settings associated with one or more particular operations of a process recipe for the substrate process. For example, the data can include a setting for a length of each operation of the substrate process, a setting for a temperature of substrate 202 after completion of each operation of the substrate process, a position of substrate 202 with respect to substrate support 250 after completion of each operation of the substrate process, a position of substrate 202 with respect to lid 230 after completion of each operation of the substrate process, etc.

In some embodiments, processing logic can obtain the data associated with the process recipe based on a notification received from client device 120. For example, a user of a manufacturing system (e.g., an operator, an engineer, etc.) can provide the data associated with the process recipe via a GUI of client device 120, in accordance with previously described embodiments. In other or similar embodiments, processing logic can obtain the data associated with the process recipe from data store 140, as previously described.

At block 612, processing logic can optionally determine one or more settings associated with the process recipe that can be modified to minimize scratching at one or more surfaces of the substrate. As described previously, in some embodiments, a user of the manufacturing system can provide the data associated with the process recipe via a GUI at client device 120. In some embodiments, the data can also include an indication of one or more settings for the process recipe that can be modified to minimize scratching at the one or more surfaces of substrate 202 and/or one or more settings that cannot be modified. In some instances, one or more settings associated with the process recipe cannot be modified due to one or more performance constraints for the process chamber and/or the manufacturing system. For example, scratching at the one or more surfaces of substrate 202 can be minimized if a setting for a length of the substrate process is modified from an initial value such as 50 s to another value, such as 60 minutes (min), however, the substrate process that is performed for a time period of 60 minutes may not satisfy a throughput or efficiency constraint for the process chamber and/or the manufacturing system. In other or similar embodiments, the data associated with the process recipe via the GUI at client device 120 can additionally or alternatively include a range of values for a process recipe setting that satisfy one or more substrate process constraints. For example, a user of the manufacturing system can provide an indication that the setting for the length of the substrate process can be between 30 seconds and 90 seconds and still satisfy a throughput and/or efficiency constraint for the manufacturing system.

Processing logic can receive a notification including the data associated with the process recipe from client device 120, as previously described, and can determine the one or more settings that can be modified in view of the notification. In other or similar embodiments, processing logic can retrieve the data associated with the process recipe from data store 140. The data associated with the process recipe at data store 140 can include an indication of the one or more process recipe settings that can be modified and/or one or more process recipe settings that cannot be modified, in some embodiments. In other or similar embodiments, the data associated with the process recipe at data store 140 can include an indication of a range of values for one or more process recipe settings that satisfy one or more process recipe constraints. Processing logic can determine the one or more settings of block 612 based on the one or more indications associated with the process recipe data stored at data store 140.

At block 614, processing logic can provide the data associated with the one or more operations of the process recipe as an input to a trained machine learning model. The trained machine learning model can be model 190, in some embodiments. As described with respect to FIG. 4, the trained machine learning model can be trained to predict one or more process recipe settings that correspond to a target scratch profile for substrate 202 to be processed at process chamber 200. In some embodiments, processing logic can also provide data associated with the indication of one or more process recipe settings of the process recipe that can and/or cannot be modified to minimize scratching, as determined at block 612, as input to the trained machine learning model. In other or similar embodiments, processing logic can additionally or alternatively provide data associated with the range of values for the process recipe settings that satisfy the one or more process recipe constraints.

At block 616, processing logic obtains one or more outputs of the machine learning model. In some embodiments, the one or more outputs can be associated with temperature control process data corresponding to a target scratch profile for one or more surfaces of the substrate. The target scratch profile for the one or more surfaces of the substrate corresponds to a minimal number of scratches, a minimal depth of the scratches, and/or a minimal length of the scratches on the one or more surfaces of the substrate after performance of the substrate in accordance with the respective set of process recipe settings. In one example, the temperature control process data can include one or more sets of process recipe settings and, for each set of process recipe settings, an indication of a level of confidence that a respective set of settings is associated with a scratch profile that corresponds to the target scratch profile. The temperature control process data can include process data associated with control of a temperature of a substrate (including a rate of change of the temperature of the substrate), which can include settings of heating elements (e.g., power settings for heating elements), pressure settings above and/or below the substrate, gas flow rates, and/or other process settings that affect temperature of a substrate.

At block 618, processing logic determines, based on the one or more outputs of the machine learning model, a set of process recipe settings that corresponds to the target scratch profile. For example, processing logic can identify a set of process recipe settings of the temperature control process data that is associated with a scratch profile that matches or approximately matches the target scratch profile. If none of the process recipe settings of the temperature control process data match or approximately match the target scratch profile, processing logic can identify a set of process recipe settings that is associated with a scratch profile that most closely matches the target scratch profile. For example, processing logic can determine that the number, depth, and length of scratches of the scratch profile associated with each set of process recipe settings of the temperature control process data do not correspond to the number, depth, and length of scratches of the target scratch profile. Accordingly, processing logic can identify a set of process recipe settings that corresponds to a scratch profile including, for example, a number of scratches that corresponds to the number of scratches of the target profile, a depth of scratches that corresponds to the depth of scratches of the target profile, or a length of scratches that corresponds to the length of scratches of the target profile.

At block 620, processing logic determines whether a level of confidence criterion for of the set of process recipe settings is satisfied. Processing logic can determine that a level of confidence criterion for a respective set of process recipe settings is satisfied in response to determining that the level of confidence that the respective set of process recipe settings corresponds to the target scratch profile exceeds a threshold level of confidence and/or is associated with a larger level of confidence than other levels of confidence for other sets of process recipe settings. In response to determining that the level of confidence criterion is not satisfied for any of the one or more sets of process recipe settings, method 600 ends. In other or similar embodiments, processing logic can initiate the substrate process according to the one or more process recipe settings provided as input to the trained machine learning model. In response to processing logic determining that the level of confidence criterion is satisfied for a respective set of process recipe settings, method 600 proceeds to block 622.

At block 622, processing logic performs the substrate temperature control process for the substrate at the process chamber in accordance with the determined set of process recipe settings. In some embodiments, processing logic can update the one or more process settings provided as input to the trained machine learning model to correspond to the determined set of process recipe settings included in the output of the trained machine learning model. For example, a process recipe setting included in the data for the substrate process provided by a user via a GUI of client device 120 can provide that an overall length of the substrate process is to be 50 seconds. The set of process recipe settings that are determined to satisfy the level of confidence criterion can include a setting that provides the optimized length of the substrate process should be 90 seconds. In some embodiments, processing logic can update process length setting for the process recipe from the initial 50 second value to the optimized 90 second value.

In other or similar embodiments, processing logic can provide a notification to the client device 120 indicating the optimized setting of the substrate process. Client device 120 can provide a notification via the GUI of the client device 120 indicating the optimized setting for the substrate process and one or more GUI elements (e.g., buttons) that enable the user to modify the process recipe settings for the substrate process to correspond to the optimized setting. In some embodiments, processing logic, or another processing device for the manufacturing system, can perform the process recipe in accordance with the optimized process recipe in response to receiving a notification of a user interaction with the one or more GUI elements of the client device.

Figure 7:
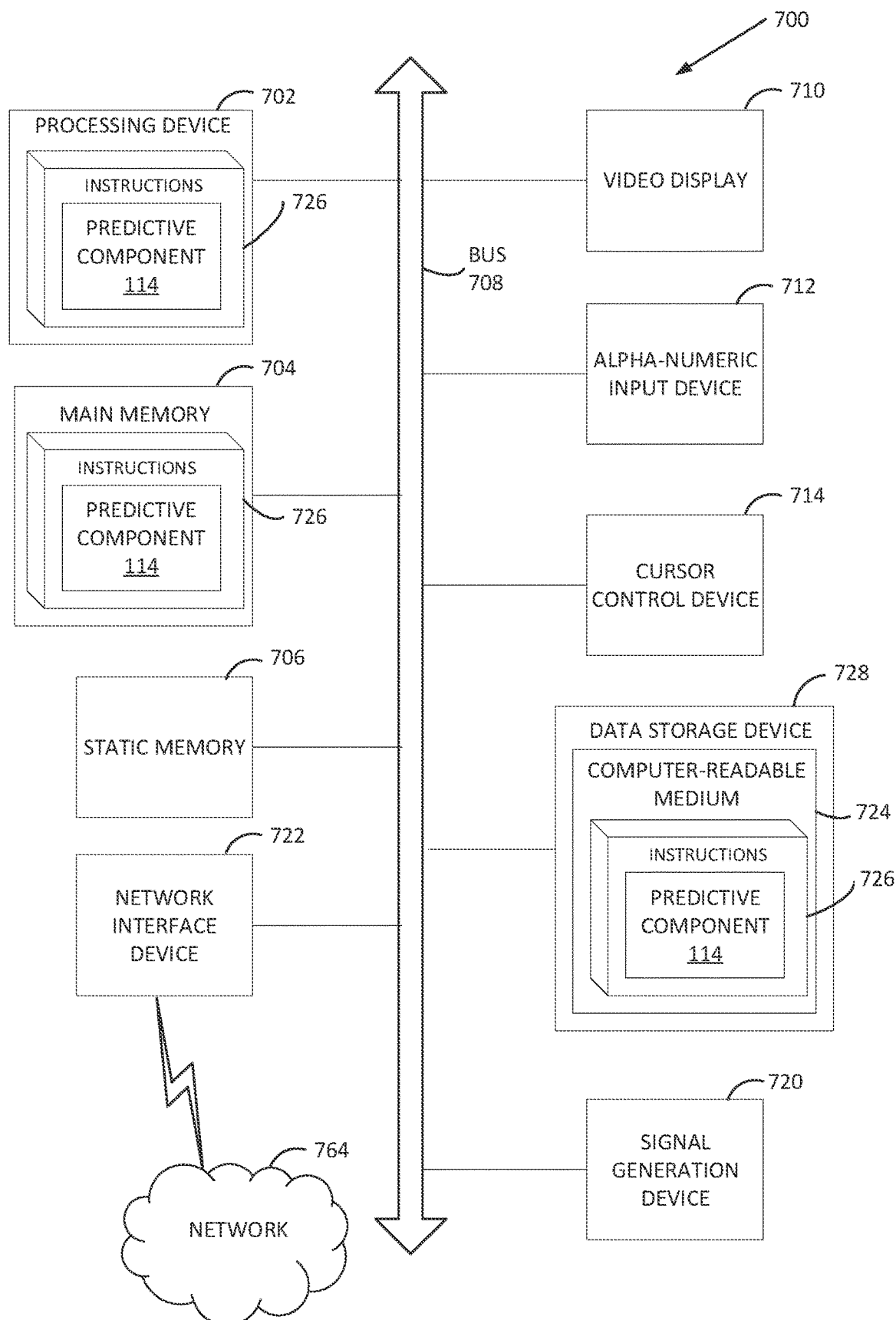
FIG. 7 depicts a block diagram of an illustrative computer system operating in accordance with one or more aspects of the present disclosure.

FIG. 7 depicts a block diagram of an illustrative computer system operating in accordance with one or more aspects of the present disclosure. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 700 can correspond to predictive server 112 of FIG. 1 or another processing device of system 100.

The example computing device 700 includes a processing device 702, a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 728), which communicate with each other via a bus 708.

Processing device 702 can represent one or more general-purpose processors such as a microprocessor, central processing unit, or the like. More particularly, the processing device 702 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. Processing device 702 can also be or include a system on a chip (SoC), programmable logic controller (PLC), or other type of processing device. Processing device 702 is configured to execute the processing logic for performing operations and steps discussed herein.

The computing device 700 can further include a network interface device 722 for communicating with a network 764. The computing device 700 also can include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 728 can include a machine-readable storage medium (or more specifically a non-transitory computer-readable storage medium) 724 on which is stored one or more sets of instructions 726 embodying any one or more of the methodologies or functions described herein. Wherein a non-transitory storage medium refers to a storage medium other than a carrier wave. The instructions 726 can also reside, completely or at least partially, within the main memory 704 and/or within the processing device 702 during execution thereof by the computer device 700, the main memory 704 and the processing device 702 also constituting computer-readable storage media.

The computer-readable storage medium 724 can also be used to store model 190 and data used to train model 190. The computer readable storage medium 724 can also store a software library containing methods that call model 190. While the computer-readable storage medium 724 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    providing, as input to a trained machine learning model, process recipe data associated with a process to be performed for a substrate at a process chamber;
    determining, based on one or more outputs of the machine learning model, a set of process recipe settings for the process that minimizes scratching on one or more surfaces of the substrate; and
    performing the process for the substrate at the process chamber in accordance with the determined set of process recipe settings.

2. The method of claim 1, wherein the set of process recipe settings comprises at least one of a positional setting for a position of the substrate within the process chamber, a temperature setting for one or more components of the process chamber, a pressure setting for an environment within the process chamber, a gas flow setting associated with a gas flowed into the process chamber during the process, or a time period setting associated with a length of a time period of the performance of the process.

3. The method of claim 1, further comprising:
    receiving an indication of a set of target process recipe settings for the process to be performed for the substrate; and
    updating the set of target process recipe settings to correspond with the determined set of process recipe settings, wherein performing the process in accordance with the respective process recipe settings comprises executing one or more operations of a process recipe associated with the process based on the updated set of target process recipe settings.

4. The method of claim 3, further comprising:
    determining one or more first process recipe settings of the set of target process recipe settings that can be modified for the process and one or more second process recipe settings of the set of target process recipe settings that cannot be modified for the process; and
    providing an indication of the one or more first process recipe settings and the one or more second process recipe settings as additional input to the trained machine learning model, wherein the determined set of process recipe settings corresponds to a modified version of the one or more first process recipe settings of the set of target process recipe settings.

5. The method of claim 1, wherein the determined set of process recipe settings further minimizes at least one of a depth of surface scratches on the one or more surfaces of the substrate or a minimal length of the surface scratches.

6. The method of claim 1, wherein the process to be performed for the substrate comprises at least one of a heating process or a cooling process.

7. The method of claim 1, wherein the machine learning model is trained using historical data associated with one or more prior process recipe settings for a prior process performed for a prior substrate at a prior process chamber and historical scratch data of one or more surfaces of the prior substrate after performance of the prior process according to the one or more prior process recipe settings.

8. A system comprising:
    a memory; and
    a processing device coupled to the memory, the processing device to:
        provide, as input to a trained machine learning model, process recipe data associated with a process to be performed for a substrate at a process chamber;
        determine, based on one or more outputs of the machine learning model, a set of process recipe settings for the process that minimizes scratching on one or more surfaces of the substrate; and
        perform the process for the substrate at the process chamber in accordance with the determined set of process recipe settings.

9. The system of claim 8, wherein the set of process recipe settings comprises at least one of a positional setting for a position of the substrate within the process chamber, a temperature setting for one or more components of the process chamber, a pressure setting for an environment within the process chamber, a gas flow setting associated with a gas flowed into the process chamber during the process, or a time period setting associated with a length of a time period of the performance of the process.

10. The system of claim 8, wherein the processing device is further to:
    receive an indication of a set of target process recipe settings for the process to be performed for the substrate; and update the set of target process recipe settings to correspond with the determined set of process recipe settings, wherein performing the process in accordance with the respective process recipe settings comprises executing one or more operations of a process recipe associated with the process based on the updated set of target process recipe settings.

11. The system of claim 10, wherein the processing device is further to:
   determine one or more first process recipe settings of the set of target process recipe settings that can be modified for the process and one or more second process recipe settings of the set of target process recipe settings that cannot be modified for the process; and
   provide an indication of the one or more first process recipe settings and the one or more second process recipe settings as additional input to the trained machine learning model, wherein the determined set of process recipe settings corresponds to a modified version of the one or more first process recipe settings of the set of target process recipe settings.

12. The system of claim 8, wherein the determined set of process recipe settings further minimizes at least one of a depth of surface scratches on the one or more surfaces of the substrate or a minimal length of the surface scratches.

13. The system of claim 8, wherein the process to be performed for the substrate comprises at least one of a heating process or a cooling process.

14. A non-transitory machine-readable storage medium storing instructions, wherein the instructions, when executed cause a processing device to perform operations comprising:
   providing, as input to a trained machine learning model, process recipe data associated with a process to be performed for a substrate at a process chamber;
   determining, based on one or more outputs of the machine learning model, a set of process recipe settings for the process that minimizes scratching on one or more surfaces of the substrate; and
   performing the process for the substrate at the process chamber in accordance with the determined set of process recipe settings.

15. The non-transitory machine-readable storage medium of claim 14, wherein the set of process recipe settings comprises at least one of a positional setting for a position of the substrate within the process chamber, a temperature setting for one or more components of the process chamber, a pressure setting for an environment within the process chamber, a gas flow setting associated with a gas flowed into the process chamber during the process, or a time period setting associated with a length of a time period of the performance of the process.

16. The non-transitory machine-readable storage medium of claim 14, wherein the operations further comprise:
   receiving an indication of a set of target process recipe settings for the process to be performed for the substrate; and
   updating the set of target process recipe settings to correspond with the determined set of process recipe settings, wherein performing the process in accordance with the respective process recipe settings comprises executing one or more operations of a process recipe associated with the process based on the updated set of target process recipe settings.

17. The non-transitory machine-readable storage medium of claim 16, wherein the operations further comprise:
   determining one or more first process recipe settings of the set of target process recipe settings that can be modified for the process and one or more second process recipe settings of the set of target process recipe settings that cannot be modified for the process; and
   providing an indication of the one or more first process recipe settings and the one or more second process recipe settings as additional input to the trained machine learning model, wherein the determined set of process recipe settings corresponds to a modified version of the one or more first process recipe settings of the set of target process recipe settings.

18. The non-transitory machine-readable storage medium of claim 17, wherein the determined set of process recipe settings further minimizes at least one of a depth of surface scratches on the one or more surfaces of the substrate or a minimal length of the surface scratches.

19. The non-transitory machine-readable storage medium of claim 14, wherein the process to be performed for the substrate comprises at least one of a heating process or a cooling process.

20. The non-transitory machine-readable storage medium of claim 14, wherein the machine learning model is trained using historical data associated with one or more prior process recipe settings for a prior process performed for a prior substrate at a prior process chamber and historical scratch data of one or more surfaces of the prior substrate after performance of the prior process according to the one or more prior process recipe settings.

* * * * *